United States Patent
Ise et al.

(10) Patent No.: US 10,356,339 B2
(45) Date of Patent: Jul. 16, 2019

(54) IMAGE PICKUP DEVICE AND IMAGING APPARATUS WITH REDUCING MAGNIFICATION PROCESSING

(71) Applicant: CANON KABUSHIKI KAISHA, Tokyo (JP)

(72) Inventors: Makoto Ise, Tokyo (JP); Shinobu Watanabe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/567,145

(22) PCT Filed: May 24, 2016

(86) PCT No.: PCT/JP2016/002529
§ 371 (c)(1),
(2) Date: Oct. 17, 2017

(87) PCT Pub. No.: WO2016/194339
PCT Pub. Date: Dec. 8, 2016

(65) Prior Publication Data
US 2018/0103214 A1   Apr. 12, 2018

(30) Foreign Application Priority Data

May 29, 2015  (JP) ................. 2015-109426
May 29, 2015  (JP) ................. 2015-109429
Apr. 22, 2016  (JP) ................. 2016-086544

(51) Int. Cl.
*H04N 5/262*   (2006.01)
*H04N 5/232*   (2006.01)
(Continued)

(52) U.S. Cl.
CPC ....... *H04N 5/2628* (2013.01); *H01L 27/1464* (2013.01); *H01L 27/14634* (2013.01);
(Continued)

(58) Field of Classification Search
CPC ............ H04N 5/2628; H04N 5/23296; H04N 5/3745; H04N 5/37455; H04N 5/378; H04N 5/77; H04N 5/772; H04N 5/91
See application file for complete search history.

(56) References Cited

U.S. PATENT DOCUMENTS 4,783,838 A * 11/1988 Matsunawa .......... H04N 1/3935
358/3.07
6,342,924 B1 * 1/2002 Ikeda .................. H04N 5/4401
348/473
(Continued)

FOREIGN PATENT DOCUMENTS

JP   2008-092291 A   4/2008
JP   2008-193359 A   8/2008
(Continued)

OTHER PUBLICATIONS

U.S. Appl. No. 15/567,437, filed Oct. 18, 2017 (First Named Inventor: Yusaku Motonaga).
(Continued)

*Primary Examiner* — Antoinette T Spinks
(74) *Attorney, Agent, or Firm* — Venable LLP

(57) ABSTRACT

A frame memory and a computing processing unit are provided within an image pickup device having a first semiconductor substrate and a second semiconductor substrate mutually stacked and electrically directly connected, and digital image data having undergone resize processing are output from the image pickup device.

12 Claims, 19 Drawing Sheets

(51) Int. Cl.
*H04N 5/3745* (2011.01)
*H04N 5/77* (2006.01)
*H01L 27/146* (2006.01)
*H04N 5/378* (2011.01)
*H04N 5/91* (2006.01)
*H04N 5/374* (2011.01)
*H04N 5/369* (2011.01)

(52) U.S. Cl.
CPC ... *H01L 27/14636* (2013.01); *H04N 5/23296* (2013.01); *H04N 5/374* (2013.01); *H04N 5/378* (2013.01); *H04N 5/379* (2018.08); *H04N 5/37455* (2013.01); *H04N 5/77* (2013.01); *H04N 5/772* (2013.01); *H04N 5/91* (2013.01)

(56) References Cited

U.S. PATENT DOCUMENTS

| | | | |
|---|---|---|---|
| 6,701,017 B1 * | 3/2004 | Nagata | H04N 7/24 348/265 |
| 8,723,998 B2 | 5/2014 | Maruta et al. | |
| 9,093,363 B2 | 7/2015 | Sukegawa et al. | |
| 9,300,859 B2 | 3/2016 | Ise | |
| 9,787,929 B2 | 10/2017 | Ise | |
| 9,894,237 B2 * | 2/2018 | Negishi | H04N 1/212 |
| 2004/0085470 A1 * | 5/2004 | Miyashita | H04N 5/23293 348/333.11 |
| 2004/0174444 A1 | 9/2004 | Ishii | |
| 2011/0141318 A1 | 6/2011 | Lee et al. | |
| 2012/0199930 A1 | 8/2012 | Hayashi | |
| 2013/0188921 A1 * | 7/2013 | Kuriyama | H04N 5/23245 386/225 |
| 2013/0320197 A1 | 12/2013 | Asayama et al. | |
| 2014/0063287 A1 | 3/2014 | Yamada | |

FOREIGN PATENT DOCUMENTS

| | | |
|---|---|---|
| JP | 2011-159958 A | 8/2011 |
| JP | 2013-026675 A | 2/2013 |
| JP | 2013-030939 A | 2/2013 |
| JP | 2015-041792 A | 3/2015 |

OTHER PUBLICATIONS

Office Action dated Jun. 27, 2017, in Japanese Patent Application No. 2016-086544.
U.S. Appl. No. 15/353,103, filed Nov. 16, 2016 (First Named Inventor: Satoshi Suzuki).
U.S. Appl. No. 15/355,460, filed Nov. 18, 2016 (First Named Inventor: Yoshiaki Miyamoto).
Search Report dated Sep. 26, 2018, in European Patent Application No. 16802781.1.
Notice of Allowance dated Mar. 18, 2019, in Korean Patent Application No. 10-2017-7032190.

* cited by examiner

MAXIMUM TRANSFER CAPABILITY: 1 Gbps @PORT

720 Mbps @PORT
NUMBER OF TRANSFER PORTS: 2 PORTS

8K4K (32M) 12 BITS 3.75 fps
4K2K (8M) 12 BITS 15 fps
FHD (2M) 12 BITS 60 fps

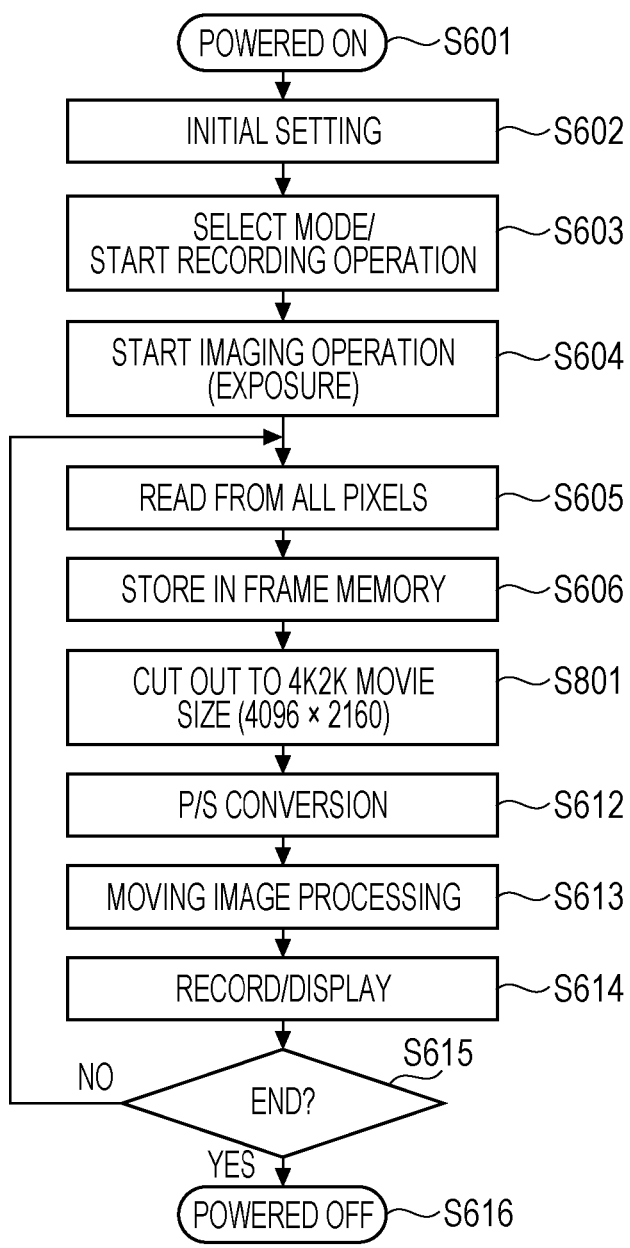

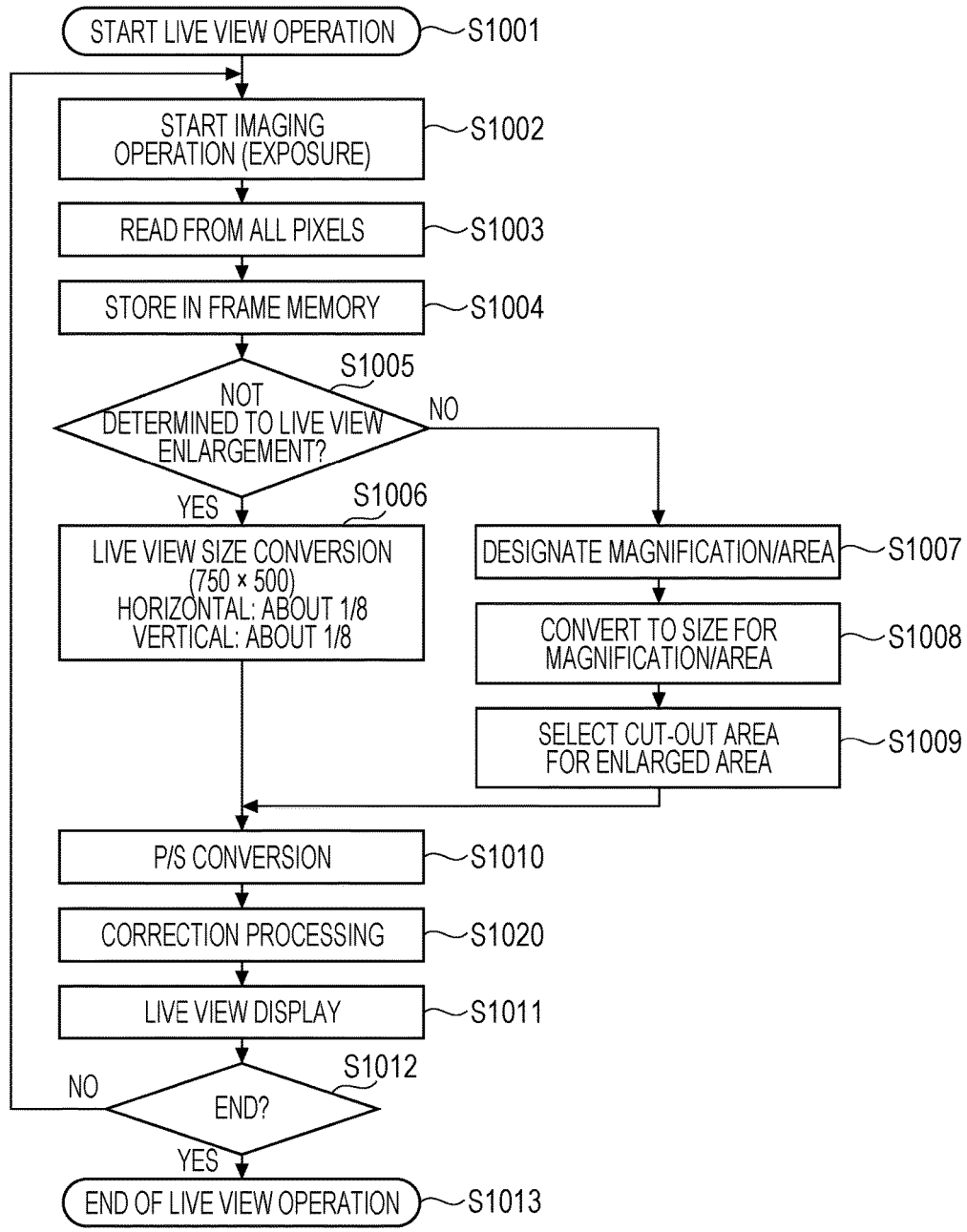

IMAGE PICKUP DEVICE AND IMAGING APPARATUS WITH REDUCING MAGNIFICATION PROCESSING

TECHNICAL FIELD

The present invention relates to an image pickup device and an imaging apparatus.

BACKGROUND ART

In recent years, as disclosed in PTL 1, a CMOS image pickup device, for example, for use in an imaging apparatus such as a digital camera may include an increased number of pixels because of miniaturization of pixels and are capable of capturing high-definition images. Recent imaging apparatuses for consumers may generally include 10 million pixels or more.

FIG. 18 is a configuration block diagram of such a general imaging apparatus. Referring to FIG. 18, an image pickup device 1500 includes a pixel part 1501, an AD conversion unit 1502, and a P/S conversion unit 1503. The pixel part 1501 converts a subject image to an electrical signal and outputs it to the AD conversion unit 1502.

The AD conversion unit 1502 converts an image signal read from the pixel part 1501 to a digital signal. The P/S conversion unit 1503 performs parallel-serial conversion on the digital signal converted by the AD conversion unit 1502. An image signal processing circuit 1600 performs a signal process on an image signal from the image pickup device 1500.

The imaging apparatus has a transfer path having a constant transfer capability for transferring an image data from the image pickup device 1500 to the image signal processing circuit 1600. Thus, an increased number of pixels in the image pickup device may relatively result in an increased transfer time of image data of a subject.

Also when the image size varies in accordance with each of image pickup modes, transferring image data of all pixels from the image pickup device 1500 to the image signal processing circuit 1600 may take time. In other words, the speed for transferring data from the image pickup device 1500 to the image signal processing circuit 1501 may be a bottleneck of the speed for reading out image data. Furthermore, such high speed transfer may increase the amount of power consumed and the amount of heat generated by the transfer circuit and the processing circuit, which may reduce the precision of the data transfer.

Accordingly, an image pickup device having a lower number of pixels may be required to be selected such that the data amount cannot exceed the transfer capability of a transfer path in a video recording at a higher frame rate. Because of this, achieving high definition video recording with a higher number of pixels may be difficult. Alternatively, in a case where an image pickup device having a higher number of pixels is used, data must be transferred from the image pickup device after the number of pixels to be read out from the pixel part is reduced by performing a thin-out process, for example.

Some imaging apparatuses may have an electronic zooming function for electronically zooming image in a target range from an imaging area while video recording is being performed and enlarging the size of the corresponding image. In the past, such an electronic zooming function is executed in the image signal processing circuit after image data of a reduced number of pixels are transferred from the image pickup device to an image signal processing circuit. Because of this, as the magnification of the electronic zooming increases, the rate of magnification of a target image increases, which may cause jaggy or degrade the sense of resolution.

CITATION LIST

Patent Literature

[PTL 1]
Japanese Patent Laid-Open No. 2013-26675

SUMMARY OF INVENTION

The present invention may provide an image pickup device capable of outputting high-quality image data with a proper transfer capability and an imaging using the same.

The present invention provides an image pickup device having a first semiconductor substrate and a second semiconductor substrate mutually stacked and electrically directly connected, the image pickup device including an imaging unit provided on the first semiconductor substrate and configured to receive and photoelectrically convert incident light, an AD conversion unit configured to convert an analog image signal output from the imaging unit to digital image data, a storage unit provided on the second semiconductor substrate and configured to store digital image data of one frame converted by the AD conversion unit, and a processing unit provided in the second semiconductor substrate and configured to perform resize processing on digital image data stored in the storage unit.

Further features of the present invention will become apparent from the following description of embodiments with reference to the attached drawings.

BRIEF DESCRIPTION OF DRAWINGS

FIG. 14 is a flowchart for explaining operations according to a fourth embodiment.

FIG. 16 is a flowchart for explaining operations according to a fifth embodiment.

DESCRIPTION OF EMBODIMENTS

Embodiments of the present invention will be described in detail below with reference to the attached drawings.

First Embodiment

Figure 1:
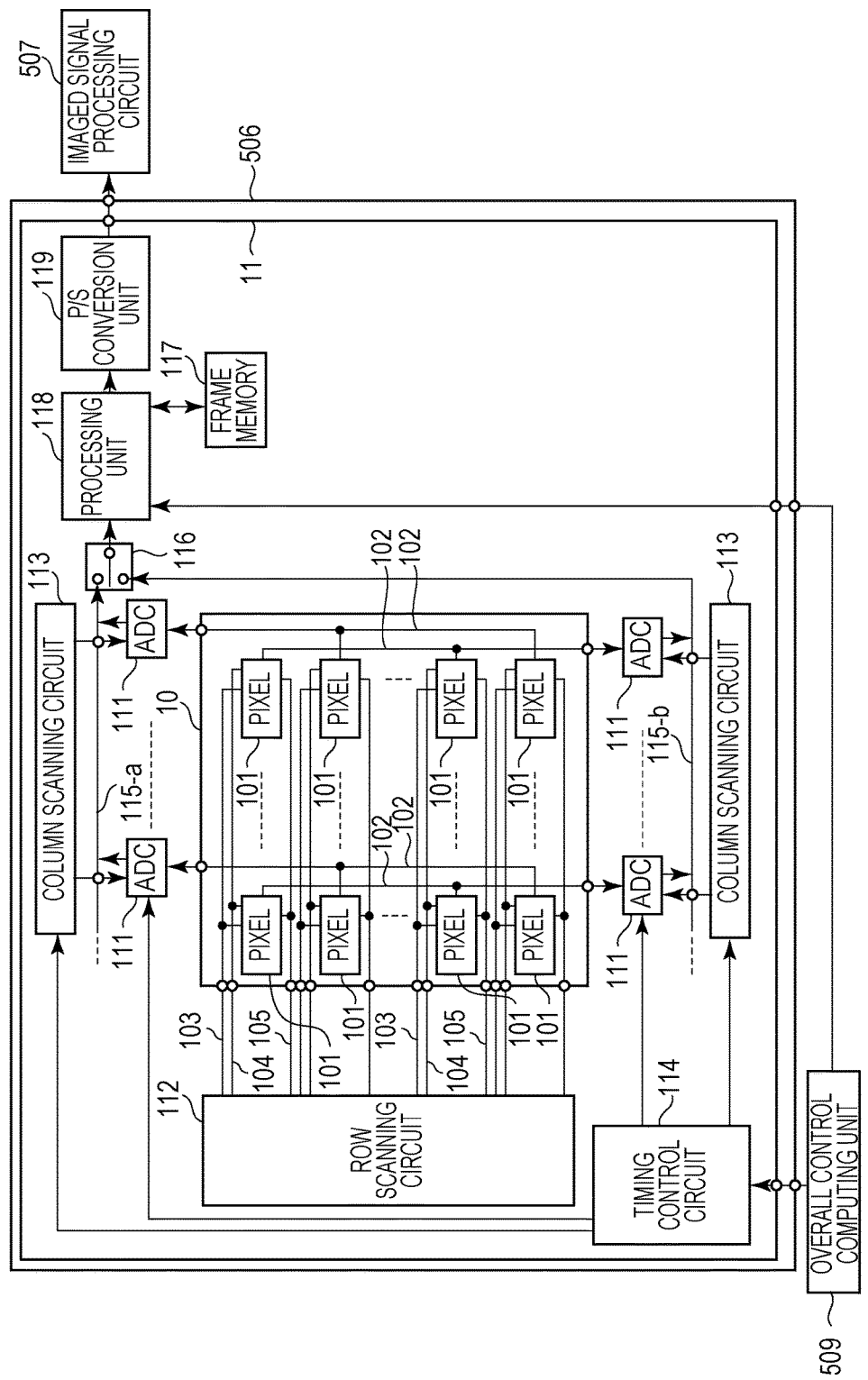
FIG. 1 illustrates a schematic structure of an image pickup device according to a first embodiment.

FIG. 1 is a block diagram schematically illustrating an image pickup device according to the first embodiment of the present invention.

An image pickup device 506 has a first chip (first semiconductor substrate) 10 and a second chip (second semiconductor substrate) 11, and the second chip 11 and the first chip 10 are mutually stacked. The first chip 10 has a pixel part having a plurality of pixels 101 arranged in a matrix form and is provided on a light entrance side (or side for receiving light of an optical image) relative to the second chip 11.

In the pixel part of the first chip 10, the plurality of pixels 101 arranged in a matrix form are connected row by row to a transfer signal line 103, a reset signal line 104, and a row select signal line 105 and are connected column by column to a plurality of column output lines 102. Pixels located in different readout rows of one same column are connected to corresponding one of a plurality of column output lines 102 each provided for one column.

The second chip 11 has a plurality of AD converters (hereinafter, each called an ADC) 111 each provided for one column, a row scanning circuit 112, a column scanning circuit 113, and a timing control circuit 114. The second chip 11 has a changeover switch 116, a frame memory 117, a processing unit 118, a parallel-serial conversion unit (hereinafter, called a P/S conversion unit) 119 and so on. The timing control circuit 114 is drive-controlled by an overall control computing unit 509.

Because of the first chip 10 having the pixel part and the second chip 11 having the drive circuit, for the pixel part, the memory, the computing unit and so on, manufacturing processes may be divided into an imaging layer and a circuit layer of the image pickup device 506. Then, thinning and densification of lines in the circuit layer can increase the speed, reduce the size and improve the functionality.

The changeover switch 116 selectively inputs digital image data of each channel output from a horizontal signal line 115-$a$ and horizontal signal line 115-$b$ provided for each channel to the processing unit 118. The processing unit 118 sorts image data of the channels, generates image data of each one frame and sequentially outputs it to the frame memory 117. The frame memory 117 temporarily stores digital image data of at least one output frame.

The processing unit 118 performs computing processes such as a resize process to a requested angle of view, a cut-out process and a thin-out process on digital image data of one frame stored in the frame memory 117. Details thereof will be described later. The digital image data of one frame having undergone a computing process such as a resize process in the processing unit 118 undergo parallel-serial conversion in the P/S conversion unit 119 and are output to an imaged signal processing circuit 507 provided externally to the image pickup device 506.

Here, data transfer paths between the horizontal signal line 115-$a$, the horizontal signal line 115-$b$, the changeover switch 116, the processing unit 118, and the frame memory 117 are digital signal lines provided within an identical chip. This can provide a data bus width necessary for completion of transfer of all horizontal data within a horizontal readout period for higher speed.

Figure 2:
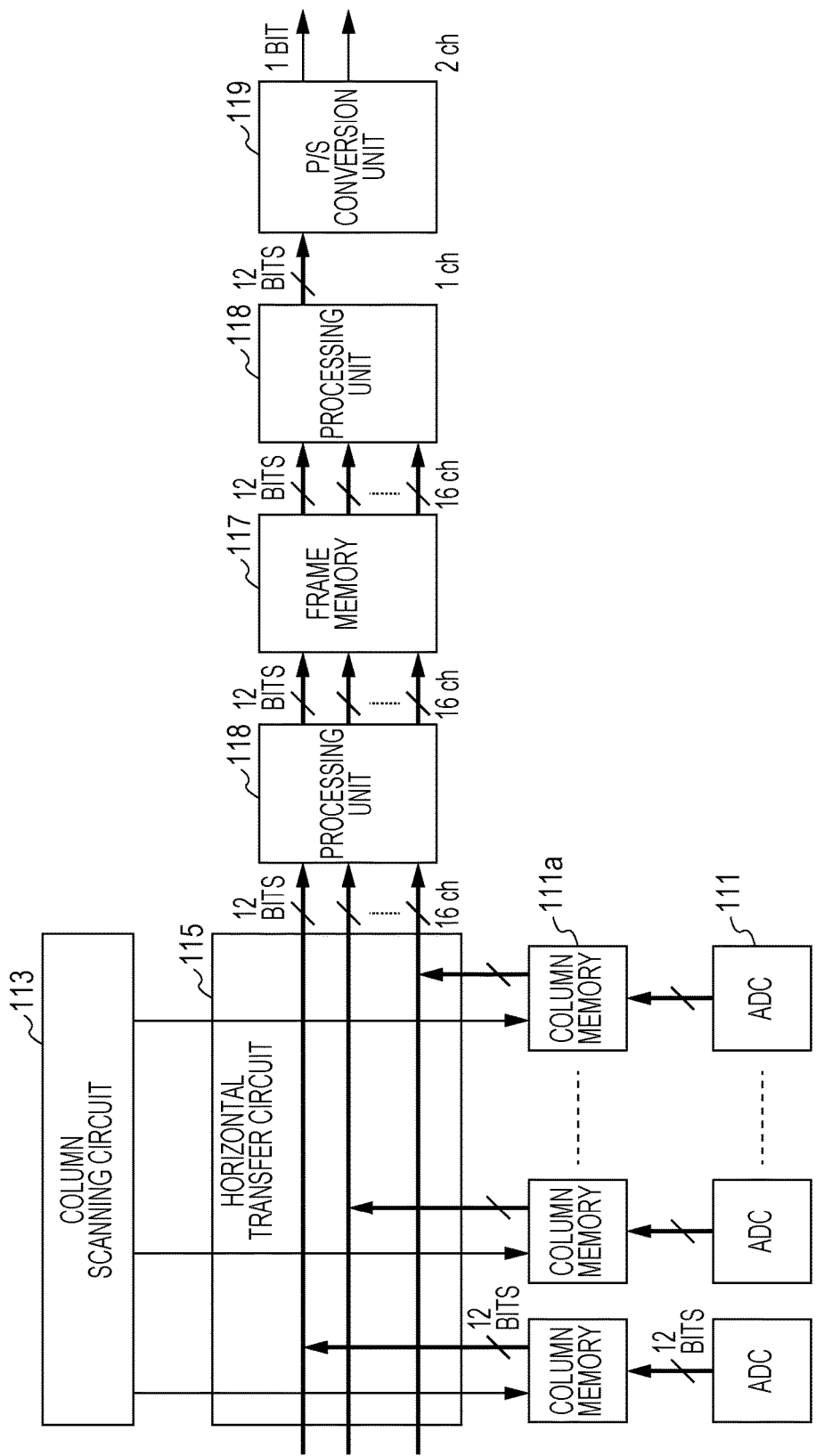
FIG. 2 illustrates an example of a data bus configuration according to the first embodiment.

FIG. 2 illustrates an example of a data bus configuration from the ADC 111 to the P/S conversion unit 119 in the second chip 11. As illustrated in FIG. 2, in the second chip 11, a column memory 111$a$ is provided between the ADC 111 and the processing unit 118 and is configured to temporarily hold an output of the digital conversion performed by the ADC 111. It should be noted that the changeover switch 116 is not illustrated in FIG. 2.

Image data held in the column memory 111$a$ provided for each column are divided into the horizontal signal lines 115-$a$ and 115-$b$ and are output in parallel in accordance with a control signal from the column scanning circuit 113. In this case, 16 channels of the horizontal signal lines 115-$a$ and 115-$b$ are provided within the horizontal transfer circuit 115. The image data output to the horizontal signal lines 115-$a$ and 115-$b$ are input to the frame memory 117 through a memory I/F circuit within the processing unit 118.

A case where image data of 8K4K (horizontal 8000 pixels and vertical 4000 pixels) 32M pixels are output from the ADC 111 will be described, for example. Reading out 32M pixel image data at a frame rate of 60 fps may require a data bus band of 1920M pixel/sec.

In a case where each of the 16 channels of the horizontal signal lines 115-$a$ and 115-$b$ provided within the horizontal transfer circuit 115 has a transfer capability of 12 bits, the transfer capability may be required to reduce to a transferable frequency of 120 MHz. A column memory is selected sequentially in accordance with a control signal from the column scanning circuit 113, and image data of 120M pixel/sec per channel in the horizontal transfer circuit 115 are read out in parallel through the 16 channels.

Of the image data input from the horizontal transfer circuit 115 to the frame memory 117 through the processing unit 118, data of a predetermined area are partially read out from the frame memory and are input again to the processing unit 118. For example, the size of the image data output from the frame memory 117 is reduced to 1/16 image size by a reducing magnification circuit within the processing unit 118. The data bus band necessary in this case is reduced to 120M pixel/sec. This is the data transfer capability for reading out full-HD size (2M pixel) image data at 60 fps.

The image data with the reduced data bus band output from the processing unit 118 are converted to serial signals in a 720M-bps double channel configuration by the P/S conversion unit 119 so as not to exceed a maximum serial transfer capability of 1 Gbps and are output.

Providing the ADC 111, processing unit 118, and frame memory 117 within the second chip 11 can provide a wide data bus band necessary for processing image data within the second chip 11 and thus can increase the transfer rate from the ADC 111 to the frame memory 117 while a high quality moving image can be output with serial transfer capability allowing external transfer to the image pickup device.

Figure 3:
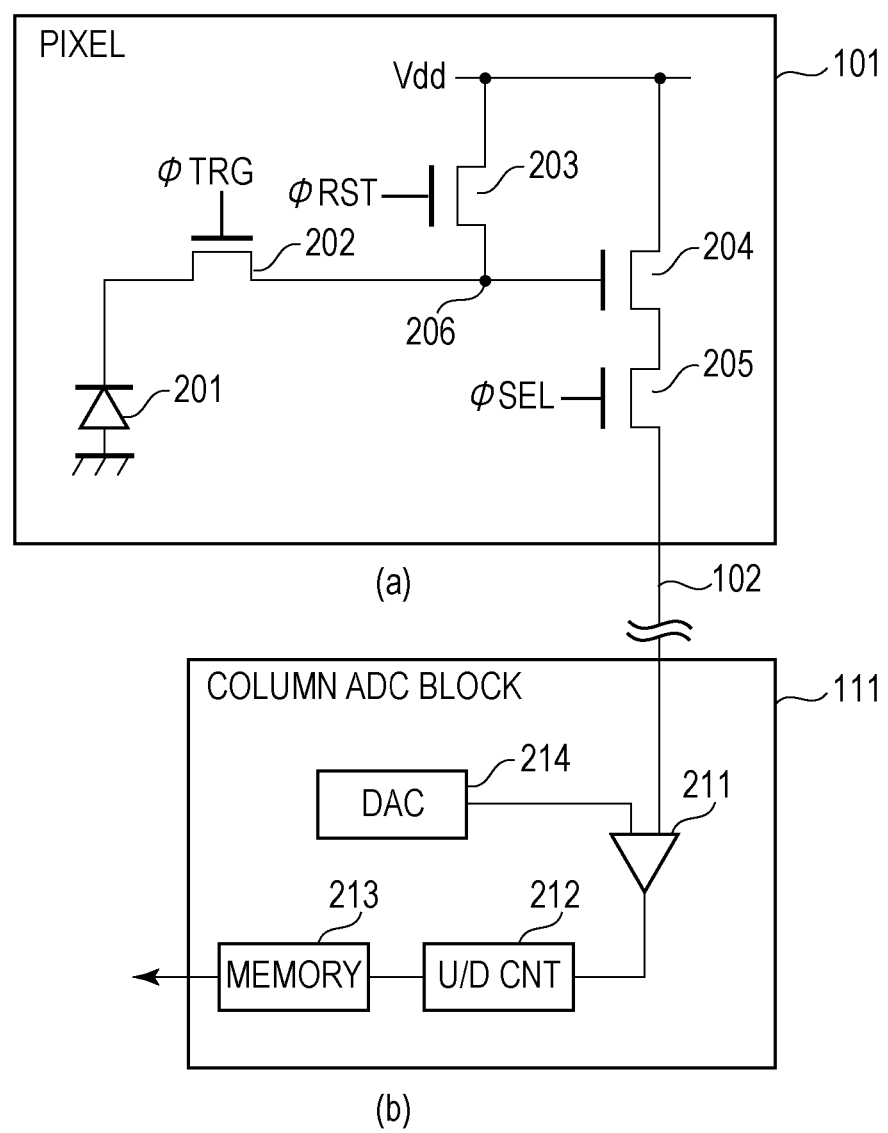
FIG. 3 illustrates a configuration of a pixel and a column ADC block according to the first embodiment.

FIG. 3 illustrates detail configurations of each pixel 101 in the pixel part and the ADC 111 in the image pickup device 506 according to this embodiment. With reference to FIG. 1 and FIG. 3, operations to be performed by the image pickup device according to the first embodiment will be described schematically.

A photodiode (hereinafter, called a PD) 201 photoelectrically converts received incident light to photo charges (electrons here) of the amount of charges corresponding to the amount of light of the received incident light. The PD 201 has a cathode electrically connected to a gate of an amplifying transistor 204 through a transferring transistor 202. The node electrically connected to the gate of the amplifying transistor 204 configures a floating diffusion (hereinafter, called an FD) unit 206.

The transferring transistor 202 is provided between the cathode of the PD 201 and the FD unit 206 and is turned on in response to supply of a transfer pulse φTRG to its gate through the transfer signal line 103 in FIG. 1. The photo charges photoelectrically converted by the PD 201 are transferred to the FD unit 206.

The reset transistor 203 has a drain connected to a pixel power supply Vdd and a source connected to the FD unit 206 and is turned on in response to supply of a reset pulse φRST to its gate through the reset signal line 104 in FIG. 1. Before the transfer of signal charges from the PD 201 to the FD unit 206, electric charges in the FD unit 206 are disposed to the pixel power supply Vdd so that the FD unit 206 can be reset.

The amplifying transistor 204 has a gate connected to the FD unit 206 and a drain connected to the pixel power supply Vdd and outputs at a reset level the electric potential of the FD unit 206 after the reset by the reset transistor 203. The amplifying transistor 204 outputs at a signal level the electric potential of the FD unit 206 after the signal charges in the PD 201 are transferred by the transferring transistor 202.

The select transistor 205 may have a drain connected to a source of the amplifying transistor 204 and a source connected to a column output line 102. The select transistor 205 is turned on in response to supply of a select pulse φSEL to its gate through the row select signal line 105 in FIG. 1 and output to the column output line 102 a signal amplified by the amplifying transistor 204 by changing the pixel 101 to a selected state.

It should be noted that the select transistor 205 may be connected between the pixel power supply Vdd and the drain of the amplifying transistor 204. The transistors 202 to 205 may be N channel MOS transistors, for example. Each of the pixels 101 is not limited to the one including the four transistors but may include three transistors where the amplifying transistor 204 and the select transistor 205 are implemented by one transistor.

An analog image signal output from the pixel 101 through the column output line 102 is transmitted to the ADC 111. The ADC 111 has a comparator 211, an up-down counter 212, a memory 213, and a DA converter (hereinafter, called a DAC) 214.

The comparator 211 has a pair of input terminals one of which is connected to the column output line 102 and the other of which is connected to the DAC 214. The comparator 211 has an output terminal connected to the up-down counter 212. The timing control circuit 114 in FIG. 1 outputs a reference signal to the DAC 214 based on an instruction from the overall control computing unit 509.

The DAC 214 outputs a ramp signal changing its level as time proceeds based on the reference signal input from the timing control circuit 114 in FIG. 1. Then, the comparator 211 compares the level of the ramp signal input from the DAC 214 and the level of the image signal input from the column output line 102.

For example, the comparator 211 outputs a higher level comparison signal if the level of an image signal is lower than the level of the ramp signal and outputs a lower level comparison signal if the level of the image signal is higher than the level of the ramp signal. The up-down counter 212 counts a period in which the comparison signal is changed to a high-level or a period in which the comparison signal is changed to a low level. The count processing converts the output signals from the pixels 101 to digital values.

Alternatively, an AND circuit may be provided between the comparator 211 and the up-down counter 212. Pulse signals may be input to the AND circuit, and the number of pulse signals may be counted by the up-down counter 212.

The ADC 111 may count a count value corresponding to the reset level based on a reset signal upon reset release of the pixels 101 and may count the count value based on an optical signal after a lapse of a predetermined imaging period. A difference value between the count value associated with the optical signal and the count value associated with the reset signal may be stored in the memory 213.

The memory 213 is connected to the up-down counter 212 and stores the count value counted by the up-down counter 212. The count value stored in the memory 213 is transmitted as digital image data to the horizontal signal line 115-a and horizontal signal line 115-b in response to a drive control from the column scanning circuit 113 in FIG. 1.

Figure 4A:
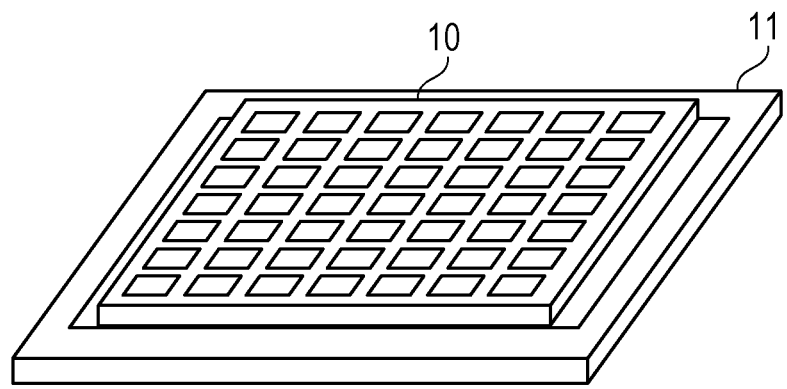
FIG. 4A illustrates a stacked configuration of the image pickup device according to the first embodiment.
Figure 4B:
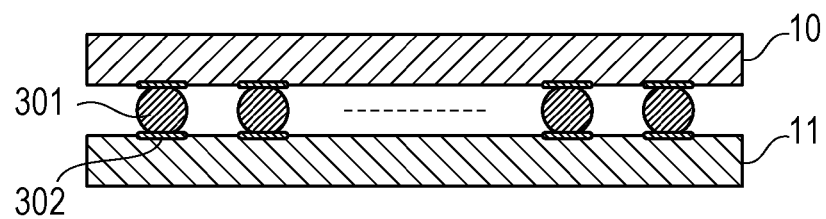
FIG. 4B illustrates a stacked configuration of the image pickup device according to the first embodiment.

FIGS. 4A and 4B illustrate a configuration of an external form of the image pickup device 506 according to the first embodiment described with reference to FIG. 1. FIG. 4A illustrates a perspective view of the image pickup device 506 from the light incident side, and FIG. 4B illustrates a cross sectional view of the image pickup device 506.

The image pickup device 506 includes the first chip (imaging layer) 10 and a second chip (circuit layer) 11. Each of the first chip 10 and the second chip 11 has a plurality of micro pads 302, and the first chip 10 and the second chip 11 are integrated by electrically connecting the micro pads 302 provided in the first chip 10 and the second chip 11 through a plurality of micro bumps 301. In other words, the first chip 10 and the second chip 11 are directly electrically connected through the plurality of macro bumps 101 and the plurality of micro pads 302. The first chip 10 and the second chip 11 may be directly electrically connected by a method without using the macro pads and micro pads.

Figure 5:
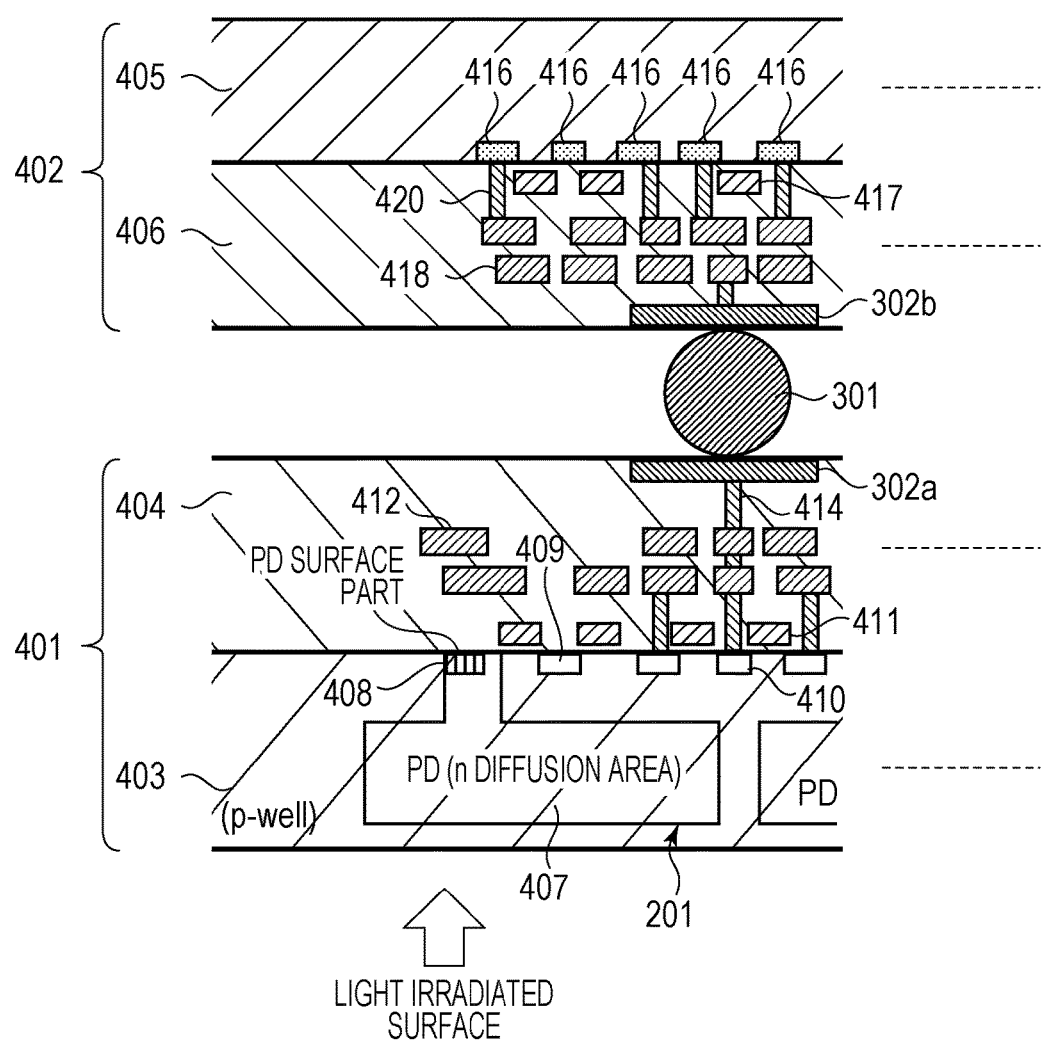
FIG. 5 is a cross sectional view illustrating the image pickup device according to the first embodiment.

FIG. 5 illustrates details of a cross sectional structure of the image pickup device 506 according to the first embodiment illustrated in FIG. 1, FIGS. 3A and 3B, and FIGS. 4A and 4B. Referring to FIGS. 4A and 4B, the imaging layer 401 corresponds to the first chip 10, and the circuit layer 402 corresponds to the second chip 11.

In the imaging layer 401, a wiring layer 404 is provided on a silicon (hereinafter, called Si) substrate 403. The Si substrate 403 has an n type diffusion area 407 being the PD 201 and a p+ diffusion area 408 in a surface part (a boundary part with the wiring layer 404 of the wiring layer 404).

The Si substrate 403 has in its surface part a plurality of n+ diffusion areas 409 being the FD unit 206 and a plurality of n+ diffusion areas 410 of switching transistors. The wiring layer 404 has a gate line 411 of the transistor and a signal propagation line 412 within an insulating layer of SiO2, for example, and has a micro pad 302a of Cu in its surface part.

The n+ diffusion area 409, the n+ diffusion area 410 and the gate line 411 of the transistors configure the transferring transistor 202, the reset transistor 203, the amplifying transistor 204, and the select transistor 205. The wiring layer 404 has a via 414 for connecting the n+ diffusion area 410 to the micro pad 302a.

The circuit layer 402 has a wiring layer 406 on the Si substrate 405. The Si substrate 405 has, in its surface part, a plurality of transistor diffusion areas 416. The wiring layer 406 has an insulating layer of SiO2, for example, including a plurality of gate lines 417 for the transistors and a plurality of signal propagation lines 418 and a micro pad 302b of Cu, for example, in the surface part.

The transistor diffusion areas 416, gate lines 417 for the transistors, the signal propagation lines 418 provided in the circuit layer 402 configure circuits. The descriptions of details of the circuit cross section will be omitted. The wiring layer 406 has a via 420 for connecting the diffusion areas 416 and so on to the micro pad 302b.

The micro pad 302a provided in the wiring layer 404 of the imaging layer 401 and the micro pad 302b provided in the wiring layer 406 in the circuit layer 402 are electrically connected with each other through the micro bump 301. Though FIGS. 4A and 4B illustrate a configuration example in which the imaging layer 401 and the circuit layer 402 are connected by using the micro bump 301 as a connection terminal, they may be connected directly without using the micro bump.

Figure 6:
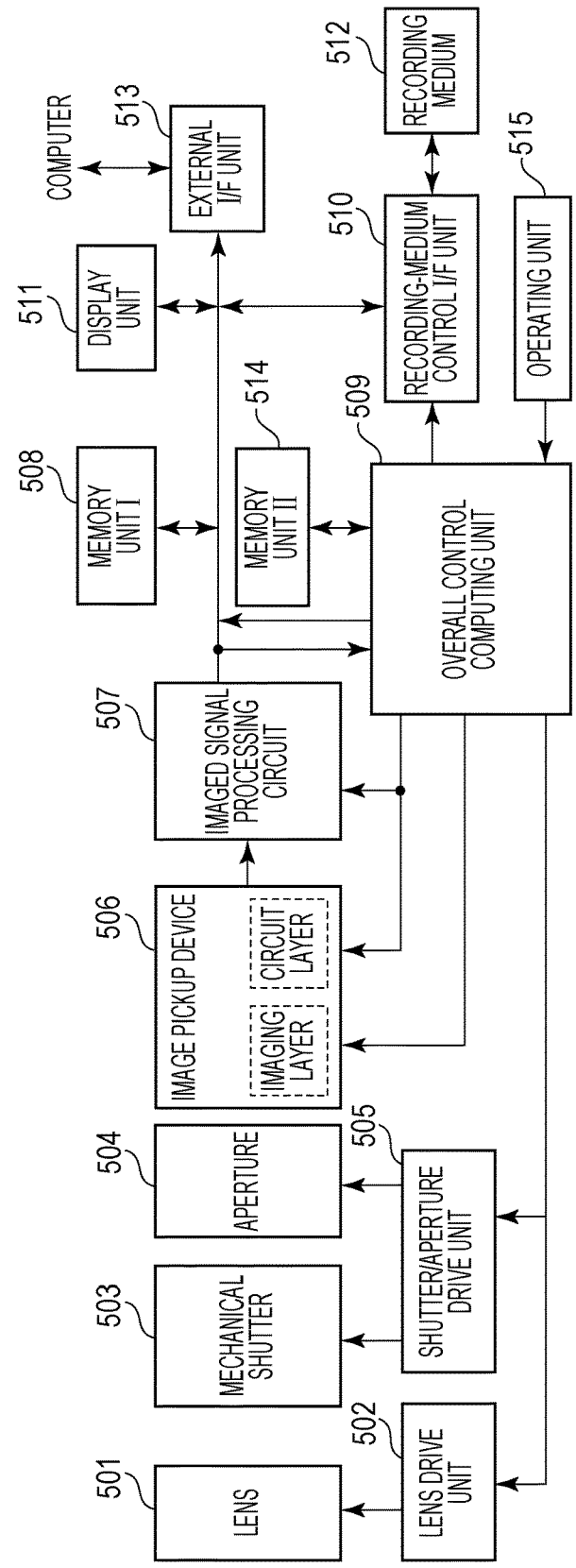
FIG. 6 is a system schematic diagram of an imaging apparatus according to the first embodiment.

FIG. 6 illustrates a system schematic diagram of an imaging apparatus using the image pickup device described with reference to FIGS. 1 to 5. A subject image having passed through a lens unit 501 is adjusted to an appropriate amount of light by an aperture 504 and is focused on an image sensing plane on the image pickup device 506 having the configurations illustrated in FIG. 1 to FIGS. 4A and 4B.

The subject image focused on the image sensing plane on the image pickup device 506 is photoelectrically converted by the PD 201 in the image pickup device 506 and undergoes gain adjustment performed by an amplifier within pixels and a column amplifier provided between the pixels 101 and the ADC 111. The ADC 111 is then used to perform A/D conversion from the analog signals to digital signals which are then supplied to the imaged signal processing circuit 507 as digital image signals of colors of R, G, and B.

In the imaged signal processing circuit 507, correction processing such as low-pass filtering and shading correction for noise reduction, image signal processing such as white balance adjustment process, and compression processing on image data are performed. It should be noted that the imaged signal processing circuit 507 configured to perform those processes may be internally contained in the image pickup device 506 having the stacked structure.

The lens unit 501 is driven by the lens drive unit 502 to control zooming and focusing, for example. A mechanical shutter 503 and the aperture 504 are drive controlled by a shutter/aperture drive unit 505.

The overall control computing unit 509 generally controls the imaging apparatus and performs computing processes. A first memory unit 508 temporarily stores image data. A detachable recording medium 512 such as a semiconductor memory records image data. A recording-medium control interface unit 510 records image data in the recording medium 512 or reads out image data recorded in the recording medium 512. It should be noted that the overall control computing unit 509 may be internally contained in the image pickup device 506 having the stacked structure.

A display unit 511 is configured to display image data, for example. An external interface unit 513 is usable for communication with an external computer, for example. A second memory unit 514 temporarily stores a computing result from the overall control computing unit 509 and parameters. Information regarding a driving condition of the imaging apparatus set by a user through the operating unit 515 is transmitted to the overall control computing unit 509 so that the overall imaging apparatus can be controlled based on the information.

Next, with reference to FIG. 1, FIGS. 3A and 3B, and FIG. 7, operating procedures in the imaging system according to the first embodiment will be described.

Figure 7:
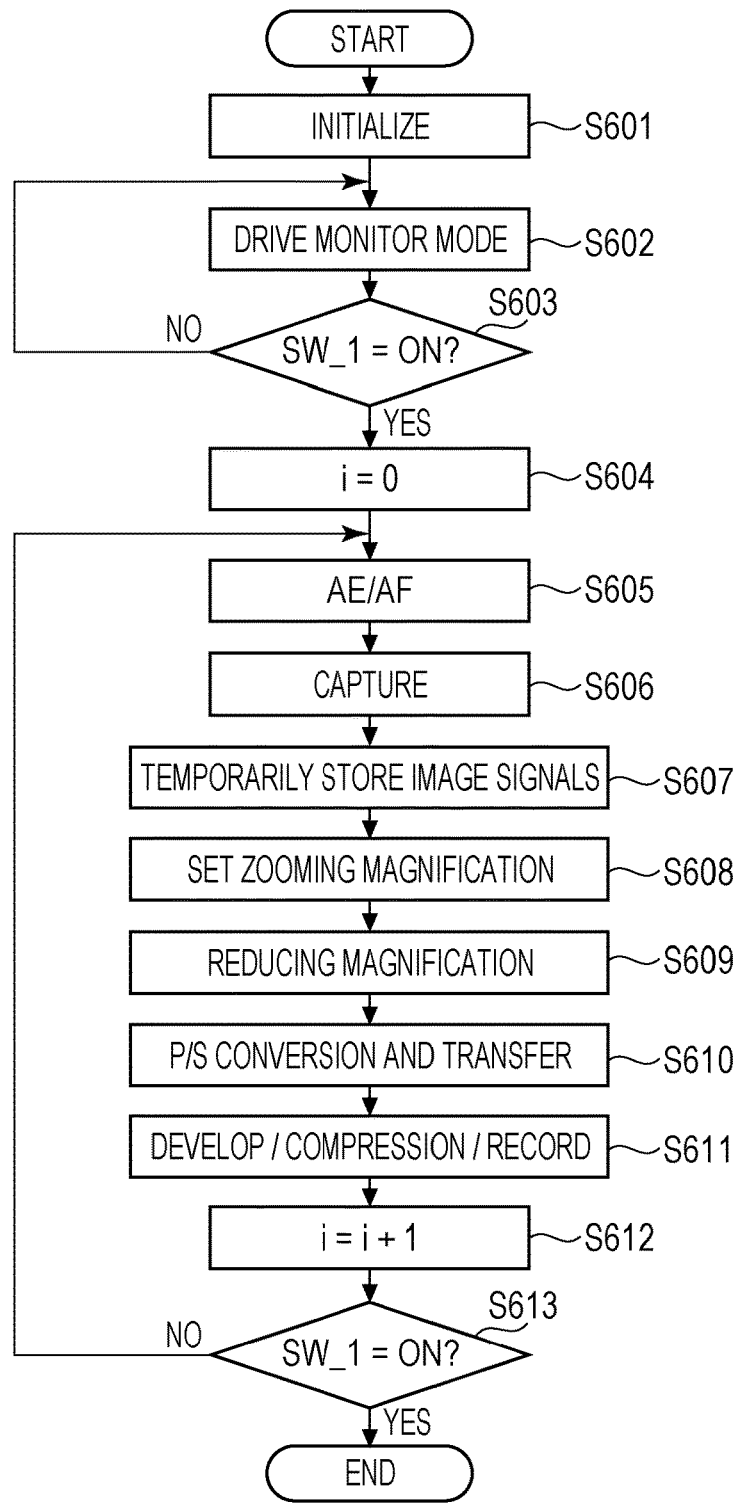
FIG. 7 is a flowchart illustrating a photographic sequence according to the first embodiment.

FIG. 7 is a flowchart illustrating a sequence for capturing a moving image and signal processing in the imaging system according to the first embodiment.

In step S601, parameters are initialized based on settings input by a user through the operating unit 515 in the overall control computing unit 509. The initialized parameters are recorded in the second memory unit 514.

In step S602, the imaging system is driven in a monitor mode in which the captured subject video is displayed on the display unit 511 in real time. More specifically, the image pickup device 506 is driven in a mix/thin-out mode in which a plurality of pixels is combined or partial pixels are thinned out to read out image signals. The read image signals undergo signal processing in the imaged signal processing circuit 507 and are displayed by the display unit 511.

While driving in the monitor mode, a photometry operation for automatic exposure adjustment (AE) control and a distance measurement operation for automatic focus adjustment (AF) control may be performed as required based on the image signals read out from the image pickup device 506. The imaged signal processing circuit 507 then measures the brightness of the subject based on the photometry result and calculates an aperture value Av, and a shutter speed Tv such that the captured image can have a proper brightness. The focal length of the subject image is further calculated based on the distance measurement result.

Though AF control is performed based on contrast information obtained from the image signals read from the image pickup device 506 here, the image pickup device 506 may have a separate focus detection pixel from pixels for imaging. AF control may then be performed based on image plane phase difference detection using phase difference information (defocus amount) obtained from the focus detection pixel. The contrast AF control and the image plane phase difference AF control may be combined for use as required in accordance with a photographing condition and a subject, for example, or the control may be performed to change the AF scheme.

The overall control computing unit 509 gives an instruction to acquire the calculated aperture value Av and shutter speed Tv to the shutter/aperture drive unit 505. The overall control computing unit 509 gives an instruction to acquire the calculated lens position L to the lens drive unit 502. The shutter/aperture drive unit 505 drives the mechanical shutter 503 and the aperture 504 in accordance with the received instruction. The lens drive unit 502 drives the lens 501 based on the given instruction. The calculated aperture value Av, shutter speed Tv, and lens position L are recorded in the second memory unit 514.

The AE control may be performed by differentiating the storage period (exposure period) between rows or pixels of the image pickup device 506 or by differentiating the gain for amplifying the image signals so that images with different exposures in one frame may be acquired for each row or each pixel. Under this control, an HDR image having a wide dynamic range can be generated.

In step S603, the overall control computing unit 509 determines the ON/OFF state of a video recording trigger switch SW_1 in the operating unit 515. If the switch SW_1 has an ON state, the processing moves to step S604. If it has an OFF state, the processing returns to step S602 again.

In step S604, a photographing parameter i is reset to 0. The photographing parameter i is a parameter representing a frame index of a moving image.

In step S605, the aperture value Av, shutter speed Tv, and lens position L are read out from the second memory unit 514. An aperture value Av and a shutter speed Tv for acquiring a proper brightness are calculated based on the image data read from the image pickup device 506 and the aperture value Av and shutter speed Tv read out from the second memory unit 514.

A lens position L for acquiring a proper focal length is further calculated from the image data read from the image pickup device 506 and the lens position L read out from the second memory unit 514. The calculated aperture value Av, shutter speed Tv, and lens position L are recorded in the second memory unit 514.

If the photographing parameter i=0, the aperture value Av and shutter speed Tv are re-calculated based on the aperture value Av and shutter speed Tv read out from the second memory unit 514 in consideration of the driving mode in step S606 and the sensitivity difference in the driving mode in step S602. The value of the lens position L read out from the second memory unit 514 is to be used.

If the photographing parameter i≠0, the aperture value Av, shutter speed Tv, and lens position L read out from the second memory unit 514 are to be used as they are. The overall control computing unit 509 then gives instructions to acquire the aperture value $Av_i$, shutter speed $Tv_i$, and lens position $L_i$ to the lens drive unit 502, shutter/aperture drive unit 505 and drives the lens 501, mechanical shutter 503, and aperture 504.

In step S606, unlike step S602, the image pickup device 506 is driven in the all pixel readout mode in which image signals are readout from all pixels on the image pickup device 506 to perform a photographing operation. Image data of one frame having a first data size acquired by the photographing operation are transmitted to the processing unit 118.

In step S607, the processing unit 118 cut outs image data corresponding to a predetermined area (such as an 8K4K size area) of the image captured in step S606 and temporarily stores them in the frame memory 117.

In step S608, the overall control computing unit 509 reads the zoom magnification X set or instructed by a user through an electronic zooming operation button in the operating unit 515. The range of the zoom magnification X settable here may be 1X to 4X, for example.

In step S609, the processing unit 118 reads out image data of an 1/X area with respect to an image center from the frame memory 117 based on the value of the set zoom magnification X. The processing unit 118 further performs reducing magnification processing for converting the read-out image data of the 1/X area to have a full HD (hereinafter, called an FHD) that is a moving image size for recording.

In step S610, the image data having undergone the reducing magnification to the FHD size in step S609 undergoes parallel/serial conversion in the P/S conversion unit 119 and are transferred to the imaged signal processing circuit 507.

The image data output from the P/S conversion unit 119 are set to have an FHD size (2M) as the data size of the image data and a frame rate of 60 fps so as to be equal to or lower than the output transfer capability of the image pickup device 506.

In step S611, in response to an instruction from the overall control computing unit 509, the processing unit 118 performs the reducing magnification process in step S609, and the imaged signal processing circuit 507 performs a process on the transferred image data in step S610. Then, the resulting data are recorded as a moving image in the recording medium 512.

The processes to be performed in the imaged signal processing circuit 507 may include image signal processing such as a low-pass filter process for reducing noise, a defect correction process, a shading correction process, and a white balance process, developing processing, image signal compression processing, for example.

In step S612, 1 is added to the parameter i to increment the frame index.

In step S613, the overall control computing unit 509 determines the ON/OFF state of the switch SW_1. If the switch SW_1 has an OFF state, the processing moves to step S605. If it has an ON, the video recording sequence ends.

Figure 8:
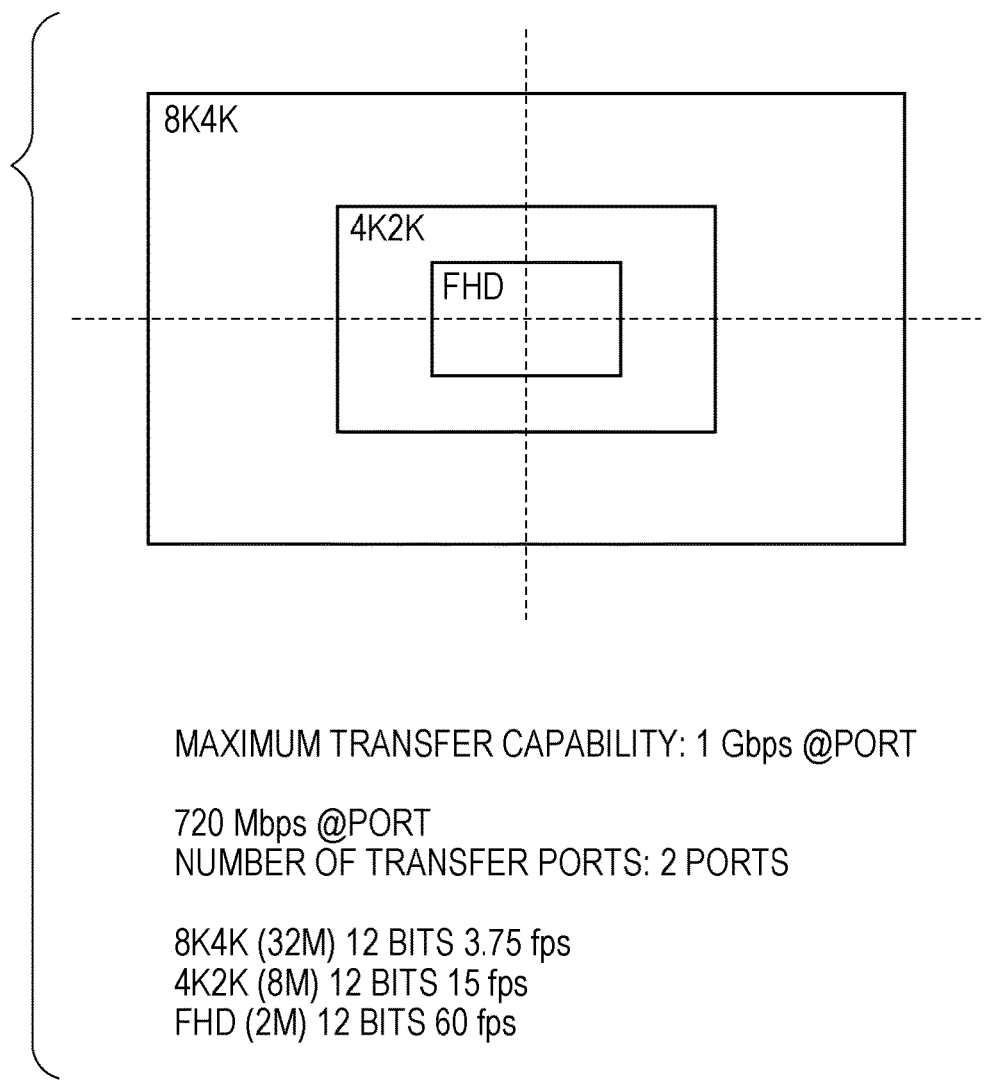
FIG. 8 illustrates a relationship between the size and the transfer rate of an image signal according to the first embodiment.

With reference to FIG. 8, a relationship will be described between the output transfer capability for image data transferred from the image pickup device 506 to the imaged signal processing circuit 507 according to this embodiment and the image size and frame rate of a moving image.

The higher limit of the transfer capability per port of a serial transfer I/F from the image pickup device 506 to the imaged signal processing circuit 507 is about 1 Gbps, and the image pickup device 506 has an output unit having two ports in the serial transfer I/F, that is, two ports.

The total amount of transfer data is equal to 1440 Mbps (=2M*12*60) where the image size of a moving image is FHD size (2M), the bit length of the image data is 12 bits, and the frame rate is 60 fps. The amount of data transfer as it is exceeds the higher limit, 1 Gbps, of the transfer capability and is therefore divided and assigned to the two ports of the serial transfer I/F so that the amount of data to be transferred per port can be equal to 720 Mbps, which does not exceed the higher limit of the transfer capability.

The image sizes of 4K2K (8M) and 8K4K (32M) are four and 16 times, respectively, of FHD (2M). In order to reduce the amount of data to be transferred approximately to that of the FHD, the frame rate must be reduced. In other words, the frame rate must be reduced to 15 fps equal to ¼ times of 60 fps of the FHD for a 4K2K size moving image and to 3.75 fps equal to 1/16 times of 60 fps of the FHD for an 8K4K size moving image.

FIGS. 9A to 9D illustrate a relationship between zoom magnification and a cut-out area in a frame memory and reducing magnification processing according to this embodiment. This embodiment assumes that the zoom magnification is variable in a range from 1X to 4X.

Figure 9A:
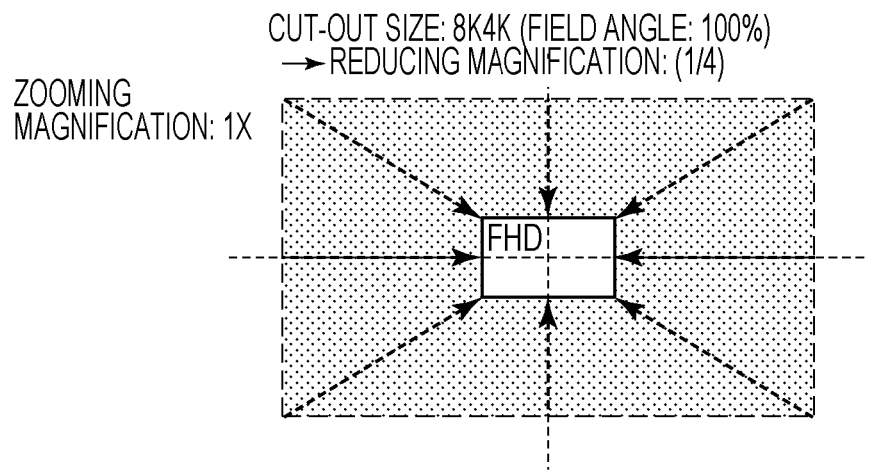
FIG. 9A illustrates a relationship between a zoom magnification and a resize process according to the first embodiment.

As illustrated in FIG. 9A, in a case where the zoom magnification is set to a minimum 1X, signals are read out from the 8K4K size (32M) cut-out area which is all of the area of the image data recorded in the frame memory 117. For converting the size to the FHD size (2M) with respect to the image center, the processing unit 118 performs reducing magnification processing to ¼X vertically and horizontally.

Figure 9B:
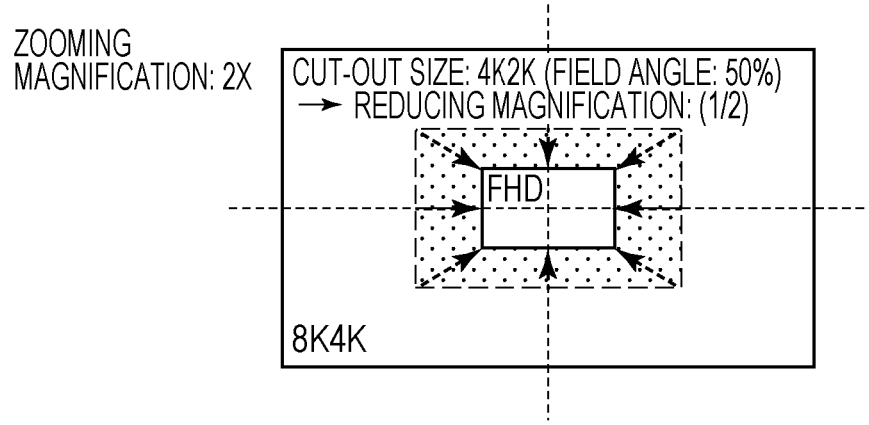
FIG. 9B illustrates a relationship between a zoom magnification and a resize process according to the first embodiment.

As illustrated in FIG. 9B, in a case where the zoom magnification is set to 2X, a 4K2K size (8M) area which is a vertically and horizontally ½ area as a cut-out area with respect to the image center is cut out from all of the area of the image data recorded in the frame memory 117. For converting the size to the FHD size (2M) with respect to the image center, the processing unit 118 performs reducing magnification processing to ½X vertically and horizontally.

Figure 9C:
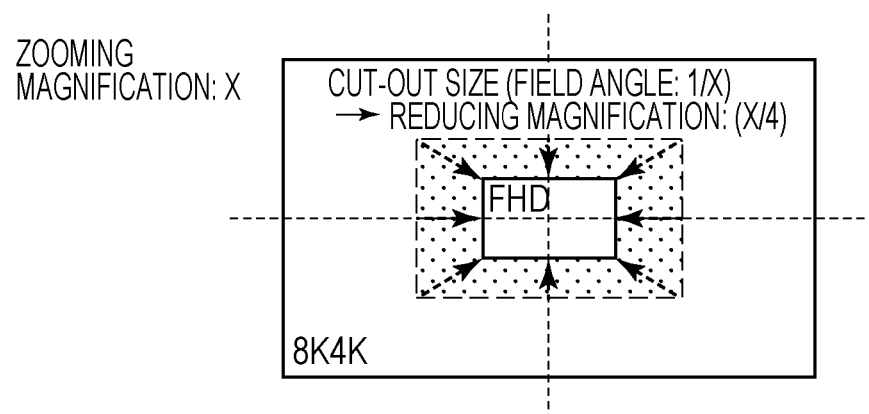
FIG. 9C illustrates a relationship between a zoom magnification and a resize process according to the first embodiment.

As illustrated in FIG. 9C, in a case where the zoom magnification is set to X, a vertically and horizontally 1/X area (32M/X2) as a cut-out area with respect to the image center is cut out from all of the area of the image data recorded in the frame memory 117. For converting the size to the FHD size (2M) with respect to the image center, the reducing magnification processing is performed to X/4 vertically and horizontally.

Figure 9D:
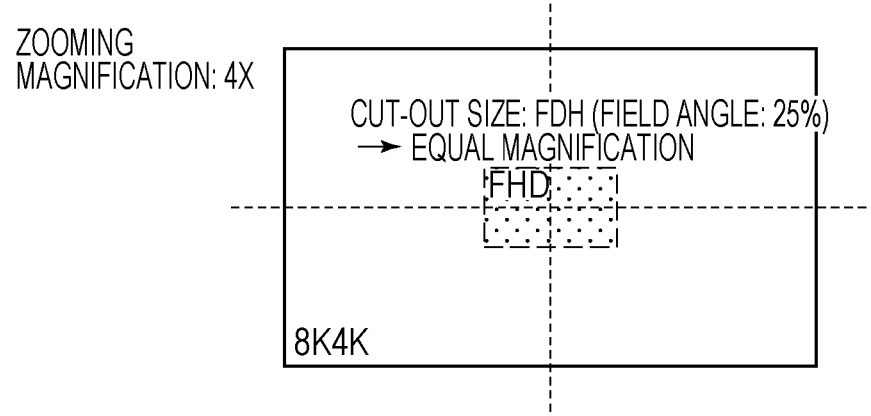
FIG. 9D illustrates a relationship between a zoom magnification and a resize process according to the first embodiment.

As illustrated in FIG. 9D, in a case where the zoom magnification is set to a maximum 4X, the FDH size (2M) area which is a vertically and horizontally ¼ area as a cut-out area with respect to the image center is cut out from all of the area of the image data recorded in the frame memory 117. Then, the image data having the FHD size (2M) are processed at the equal magnification as they are.

It is controlled, as described above, such that the size of image data whose magnification is to be reduced can always have a constant size being a moving image size for recording irrespective of the magnification applied in the reducing magnification processing.

Algorithms such as a Lanczos method, an average pixel method, and a bicubic method are generally available, and an algorithm to be applied in such a reducing magnification processing circuit is determined in consideration of tradeoffs between the size and speed of the processing circuits and image quality which may be required in the image pickup device.

Figure 10:
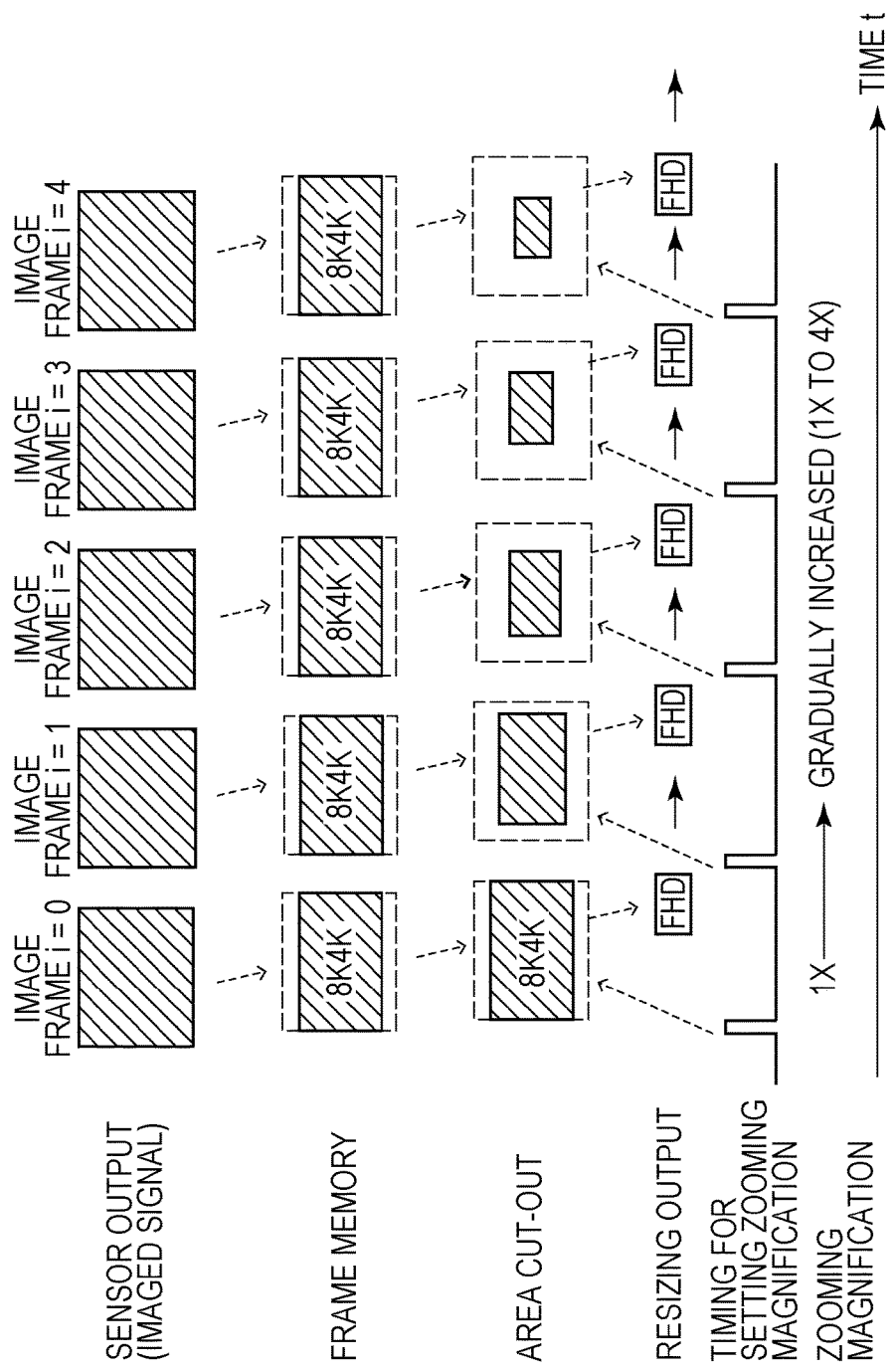
FIG. 10 is a schematic diagram illustrating time points of image processing to be performed on each frame of a moving image according to the first embodiment.

FIG. 10 is an explanatory diagram schematically illustrating image processes to be performed on sections of frames of a moving image and their time points as an example. Referring to FIG. 10, the horizontal axis indicates time t, and frames of a moving image are updated and output frame by frame with passage of time.

When a sequence for capturing a moving image starts, image data of an 8K4K size area relating to the moving image of image data read from all pixels in the image pickup device 506 at the first frame (i=0) are temporarily stored in the frame memory 117. The zoom magnification here is set to 1X. Based on the zoom magnification, image data of the 8K4K (32M) size are of the whole area stored in the frame memory 117 are read out. For converting the size to FHD size (2M) being a moving image size for recording, the processing unit 118 performs reducing magnification processing to ¼X vertically and horizontally, and the resulting image data are output from the image pickup device 506.

At the next frame (i=1) after a lapse of a time, image data of an 8K4K size area relating to the moving image of image data newly read out from all pixels of the image pickup device 506 are temporarily stored (or updated) in the frame memory. At that time, the setting for the zoom magnification is updated to a new value slightly larger than 1X. Based on the zoom magnification, image data of an area slightly smaller than the entire area are read out from the frame memory 117. Then, the image data undergo reducing magnification processing in the processing unit 118 to convert the size to the FHD size (2M) and are output from the image pickup device 506.

After this, with passage of time, the frames of the moving image are updated by changing the zoom magnification setting to be larger.

This embodiment assumes that the image size of a moving image is an FHD size, the frame rate is equal to 30 fps and the usable range of electronic zooming magnification is 1X to 4X such that the transfer capability of the serial transfer ports cannot exceed 1 Gbps. In order to achieve the assumptions, the size for reading the frame memory is designed to be an 8K4K size.

However, the transfer capability of serial transfer ports have been enhanced for higher speed year by year, and imaging apparatuses have been demanded to have larger image sizes and higher frame rates of moving images. It is apparent that embodiments of the present invention can have specifications flexibly applicable to those trends and demands.

As described above, according to the first embodiment, the image pickup device having a pixel layer and a circuit layer which are stacked has a frame memory in the circuit layer so that electronic zooming can be performed by only performing reducing magnification processing in the image pickup device without processing for enlarging the size of an image.

Second Embodiment

According to a second embodiment, there will be described an imaging apparatus having a photographing mode in which a pan/tilt process can be performed on an electronically photographed image. In other words, image data are cut out and read by moving the center of a cut-out area vertically and horizontally from the image center of image data temporarily stored in the frame memory 117, like the first embodiment.

Because the configuration of the image pickup device according to this embodiment is the same as the one described with reference to FIGS. 1 to 5 according to the first embodiment, the description will be omitted. Because the outline of the imaging system is also the same as the one described with reference to FIG. 6 according to the first embodiment, the description will be omitted. Because the reducing magnification processing to be performed on image data is the same as the one described with reference to FIGS. 9A to 9D according to the first embodiment, the description will be omitted.

Figure 11A:
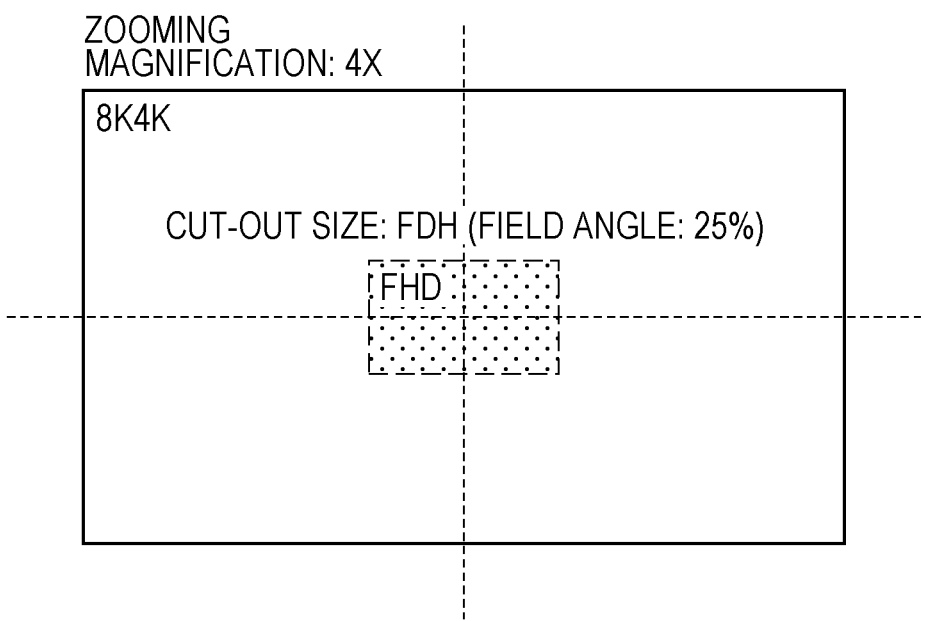
FIG. 11A illustrates a pan/tilt process according to a second embodiment.
Figure 11B:
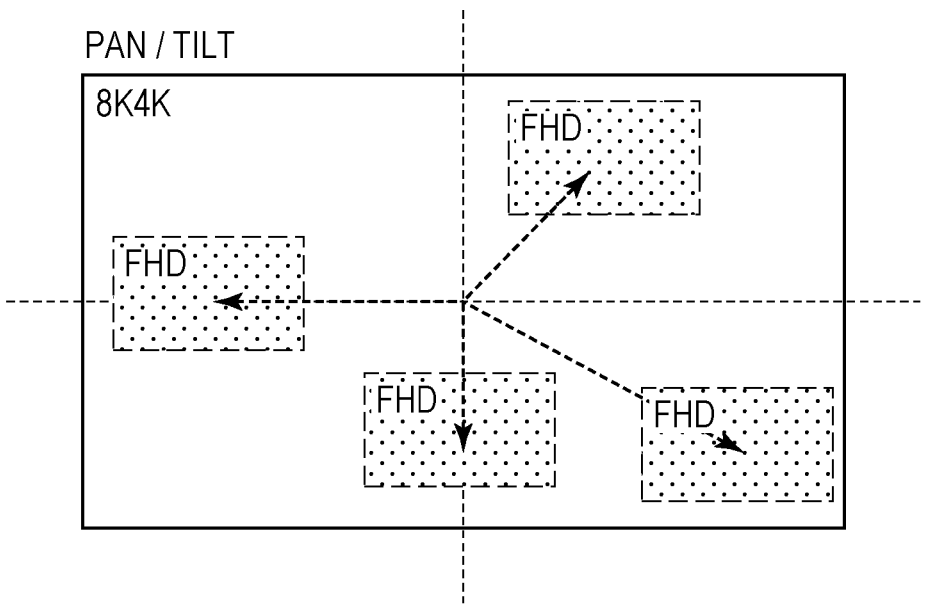
FIG. 11B illustrates a pan/tilt process according to the second embodiment.

FIGS. 11A and 11B illustrate cut-out areas from image data of an entire area recorded in the frame memory 117 in a case where the zoom magnification is set to 4X.

FIG. 11A illustrates that the FDH size (2M) area which is a vertically and horizontally ¼ area with respect to the image center is cut out from an entire area (8K4K) of the image data recorded in the frame memory 117, as illustrated in FIG. 9D according to the first embodiment.

FIG. 11B on the other hand illustrates a cut-out area according to the second embodiment. In other words, image data of the FHD size (2M) is cut out by moving the center of a cut-out area vertically and horizontally from the image center of the entire area (8K4K) of an image recorded in the frame memory 117.

The operation for moving the center of the cut-out area vertically and horizontally may be performed in accordance with a setting or an instruction given through a pan/tilt operation button provided in the operating unit 515 and may be read by the overall control computing unit 509, like an electronic zooming operation. It may also be achieved by controlling the processing unit 118 and the frame memory 117 by the overall control computing unit 509.

As described above, vertically and horizontally moving the center of a cut-out area is also applicable not only to electronic zooming but also to the pan/tilt process to be performed on an electronically photographed image. The electronic pan/tilt function is also achieved without enlarging the size of the image.

Third Embodiment

According to a third embodiment, there will be described an imaging system having a photographing mode in which a still image can be captured while video recording is being performed. According to this embodiment, an image pickup device performs photographing operations always in the all pixel readout mode, and there will be described a method for generating both of a moving image and a still image from image signals output as a result of the driving in the all pixel readout mode.

Because the configuration of the image pickup device according to this embodiment is the same as the one described with reference to FIGS. 1 to 5 according to the first embodiment, the description will be omitted. Because the outline of the imaging system is also the same as the one described with reference to FIG. 6 according to the first embodiment, the description will be omitted.

Figure 12:
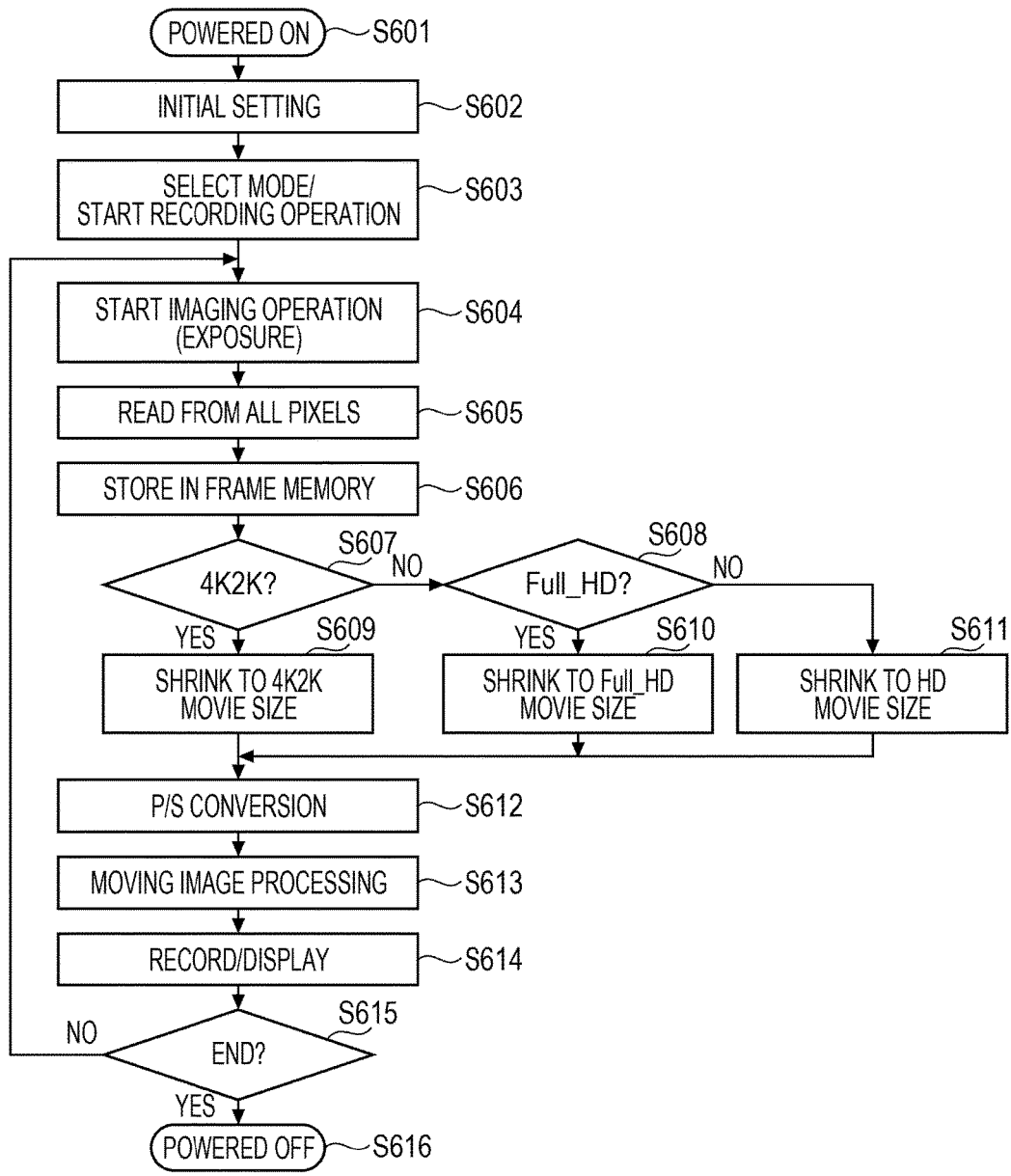
FIG. 12 is a flowchart illustrating operations according to a third embodiment.

Next, with reference to a flowchart in FIG. 12, operating procedures to be performed in the imaging system according to this embodiment will be described. In particular, operations to be performed in a case where pixel data of all pixels are resized and the pixel data for a moving image are transmitted in response to a selection of a driving mode for moving images will be described in detail. The movie modes may be a 4K2K movie mode, a Full_HD movie mode, or an HD movie mode, for example. It is assumed that the number of pixels of the image pickup device is 24 million (horizontal 6000×vertical 4000) pixels with a 3:2 aspect ratio.

In step S601, when a power supply button included in the operating unit 515 is turned on by a user, initial settings are defined in step S602.

In step S603, when a movie mode is selected as a photographing mode by the user and a moving image recording button included in the operating unit 515 is turned on, moving image recording is started. It is assumed here that one of 4K2K movie, Full_HD movie, and HD movie is selected.

In step S604, the exposure of the image pickup device 506 is started in accordance with exposure settings (storage period/aperture setting/sensitivity setting) determined by the overall control computing unit.

In step S605, signals are read out from all pixels in the image pickup device 506 exposed in step S604. In step S606, the signals read out from all pixels in step S605 are stored as image data in the frame memory 117.

In steps S607 and S608, the movie mode selected by a user for the mode setting in step S603 is determined. If the 4K2K movie is selected in step S603, the processing moves to step S609. If the Full_HD movie is selected, the processing moves to step S610. If the HD movie is selected, the processing moves to step S611.

In step S609, S610, or S611, resize conversion processing is performed to the image data having the image size in accordance with the movie mode selected by the user based on the image data of all pixels stored in the frame memory 117. Details thereof will be described below.

In step S612, the image data resized to the image size in accordance with the selected movie mode in step S609, S610, or S611 is P/S converted in the P/S conversion unit 120, and an optimum transmission speed and an optimum number of ports are selected. The P/S converted image data are transmitted to the imaged signal processing circuit 507.

In step S613, the imaged signal processing circuit 507 performs moving-image developing processing on the image data output from the P/S conversion unit 120. More specifically, image data processing and correction processing are performed such as low-pass filtering for noise reduction, shading correction, and white balance processing.

In step S614, the image data processed in step S613 are recorded as moving image data in the recording medium 512 or are displayed in a live view manner on the display unit 511.

In step S615, if the photographing operation continues, the processing returns to step S604 where the moving image recording is continuously performed. If the moving image recording ends in step S615, the power supply is turned off in step S616.

Figure 13A:
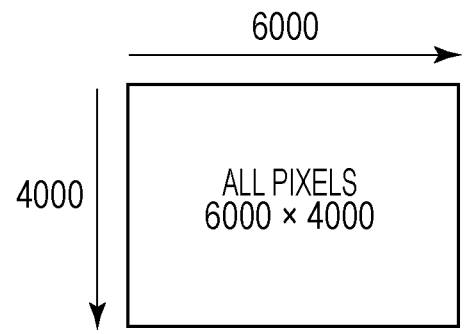
FIG. 13A illustrates a method for converting a pixel size according to the third embodiment in detail.

Next, processing for converting an image size according to this embodiment will be described with reference to FIGS. 13A to 13D. FIG. 13A illustrates image data of 24 million (horizontal 6000×vertical 4000) pixels with a 3:2 aspect ratio read out from the image pickup device.

When a user selects the 4K2K movie as a movie mode, the processing unit 118 under control of the overall control computing unit 509 performs resize conversion processing to the number of pixels necessary for the 4K2K movie. In other words, the image size for the 4K2K movie is computed from the image data of all pixels stored in the frame memory 117, and the resize conversion processing is performed based on the computed result.

Figure 13B:
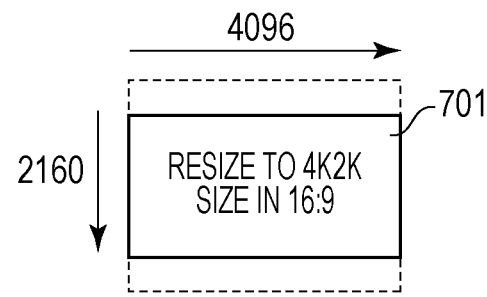
FIG. 13B illustrates a method for converting a pixel size according to the third embodiment in detail.

The horizontal and vertical sizes for the 4K2K movie are 4096×2160 (with a 16:9 aspect ratio, about 8 million pixels). Thus, image data of an area 701 corresponding to a 16:9 aspect ratio are output from the image data resized for the 4K2K movie from all pixels as illustrated in FIG. 13B.

When a user selects the Full_HD movie as a movie mode, the processing unit 118 under control of the overall control computing unit 509 performs resize conversion processing to the number of pixels for the Full_HD movie. In other words, the image size for the Full_HD movie is computed from the image data of all pixels stored in the frame memory 117, and the resize conversion processing is performed based on the computed result.

Figure 13C:
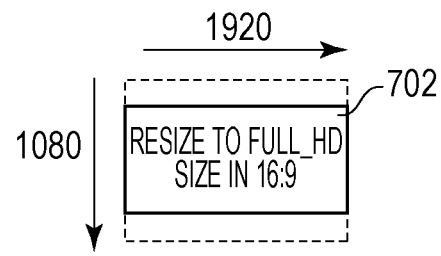
FIG. 13C illustrates a method for converting a pixel size according to the third embodiment in detail.

The horizontal and vertical sizes necessary for the Full_HD movie are 1920×1080 (with a 16:9 aspect ratio, about 2 million pixels). Thus, image data of an area 702 corresponding to a 16:9 aspect ratio are output from the image data resized for the Full_HD movie from the data of all pixels as illustrated in FIG. 13C.

When a user selects the HD movie as a movie mode, the processing unit 118 under control of the overall control computing unit 509 performs resize conversion processing to the number of pixels for the HD movie. In other words, the image size for the HD movie is computed from the image data of all pixels stored in the frame memory 117, and the resize conversion processing is performed based on the computed result.

Figure 13D:
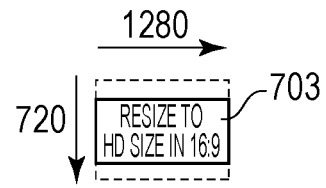
FIG. 13D illustrates a method for converting a pixel size according to the third embodiment in detail.

The horizontal and vertical sizes necessary for the HD movie are 1280×720 (with a 16:9 aspect ratio, about 1 million pixels). Thus, image data of an area 703 corresponding to a 16:9 aspect ratio are output from the image data resized for the HD movie from the data of all pixels as illustrated in FIG. 13D.

As described above the resize conversion of data of all pixels stored in the frame memory to an image size for a moving image selected by a user can greatly reduce the data amount to be transmitted from the P/S conversion unit 120 to the signal processing unit 507.

For example, it is assumed that image data of all of 24 million pixels are to be transmitted at a frame rate of 120 fps through eight ports from the P/S conversion unit 120 to the pixel signal processing circuit 507. Because the data amount of the image data to be transmitted at a frame rate of 120 fps in the 4K2K movie mode is equal to or smaller than ¼ of the data amount transmitted in the all pixel read out mode, two ports are necessary for the transmission instead of the eight ports.

When eight ports are used for the transmission, the transmission speed can be reduced to ¼ or lower. Because the data amount of image data to be transmitted in a HD movie or a VGA movie mode can be smaller, the transmission speed of the image data can further be reduced, which can reduce the power consumption.

Having described that a frame rate of 120 fps is used, variable frame rates such as 60 fps and 30 fps may be applied in a movie mode. In this case, the frame rate for reading out and transferring image data of all pixels may be changed to the frame rate for the moving image.

Having described that the number of pixels of the image pickup device according to this embodiment is 24 million pixels, embodiments of the present invention are not limited thereto, and applicable image pickup devices may have various numbers of pixels.

As described above, according to this embodiment, the image pickup device having a pixel layer and a circuit layer which are stacked has a frame memory in the circuit layer, and conversion processing from the image size in the all pixel readout mode to the image size in the movie mode selected by a user can be performed so that the data amount for transmitting the image data can be reduced. The power consumption can further be reduced.

Fourth Embodiment

According to the third embodiment, resize processing is performed for conversion of the image size in a movie mode to an optimum image size in a selected mode so that the data amount for transmitting the image data can be reduced for reduction of power consumption. According to the fourth embodiment on the other hand, details regarding an operation for cutting out an image from a full screen image will be described.

As an example in which a cut-out operation is performed according to the fourth embodiment, a 4K2K (4096×2160) moving image acquired by cutting out an angle of view from data of all pixels will be described. Because the apparatus configuration according to this embodiment is the same as those according to the aforementioned embodiments, the description will be omitted.

Operations for cutting out and reading out an angle-of-view area necessary in the 4K2K movie from data of all pixels when the 4K2K movie is selected as a movie mode by a user will be described with reference to a flowchart in FIG. 14. The description on the same operations as the operations described with reference to FIG. 12 according to the third embodiment will be omitted.

In step S603, when the 4K2K movie is selected as a movie mode by a user and the moving image recording button included in the operating unit 515 is pressed, moving image recording is started. In step S606, image data of all pixels are stored in the frame memory 117.

In step S801, under control of the overall control computing unit 509, the processing unit 118 performs processing for cutting out an angle of view from the image data of all pixels stored in the frame memory 117 to fit into the number of pixels of the 4K2K movie. The cut out image data for the 4K2K movie are transmitted to the P/S conversion unit 120. The operations in step S612 and subsequent steps are the same as those in FIG. 12 according to the first embodiment.

Figure 15A:
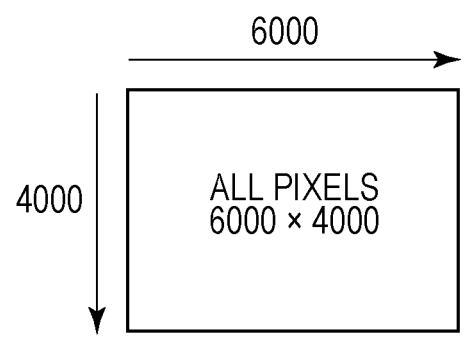
FIG. 15A illustrates a method for pixel-size cut-out processing according to the fourth embodiment in detail.

Next, image cut-out processing will be described with reference to FIGS. 15A and 15B. FIG. 15A illustrates image data of 24 million (horizontal 6000×vertical 4000) pixels with a 3:2 aspect ratio read out from the image pickup device.

When a user selects the 4K2K movie as a movie mode, the processing unit 118 under control of the overall control computing unit 509 cuts out an angle of view necessary for the 4K2K movie from the image data stored in the frame memory 117.

Figure 15B:
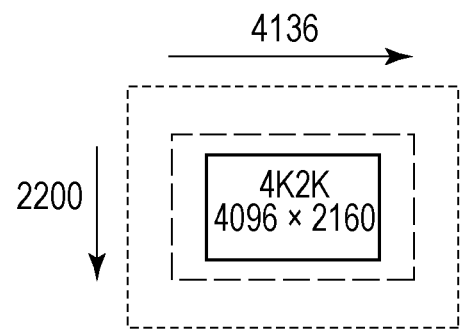
FIG. 15B illustrates a method for pixel-size cut-out processing according to the fourth embodiment in detail.

Because the horizontal and vertical sizes necessary for the 4K2K movie are 4096×2160, the angle of view cut-out processing is performed to acquire 4136×2200 image data as illustrated in FIG. 15B, for example, in consideration of corrections to be performed in the imaged signal processing circuit 507.

As described above, according to this embodiment, the image pickup device having a pixel layer and a circuit layer which are stacked has a frame memory in the circuit layer, and cut-out processing from the image size in the all pixel readout mode to the image size in the movie mode selected by a user can be performed so that the data amount for transmitting the image data can be reduced. The power consumption can further be reduced.

Fifth Embodiment

A user may perform operations for enlarging the size of a screen area of a live view movie on a display unit for manual focusing for photographing. However, when the size of an image is enlarged directly from a live-view display state as a result of thinning out of images, the resolution may be reduced, and the image quality may be deteriorated. Thus, the focusing may be difficult.

According to a fifth embodiment, operations for outputting image data by keeping the resolution and seamlessly when a user enlarges the size of an image of a predetermined area by watching a corresponding live view screen will be described. Because the apparatus configuration according to this embodiment is the same as those according to the aforementioned embodiments, the description will be omitted.

It is assumed that image data to be displayed in a live view mode are acquired by resizing image data of 24 million (6000×4000) pixels with an aspect ratio of 3:2 to an image size (750×500) suitable for the live view mode.

A display area enlargement operation from an operation for displaying a live view movie according to this embodiment will be described with reference to a flowchart illustrated in FIG. 16.

In step S1001, when a power supply button included in the operating unit 515 is turned on by a user, initial settings are defined, and shooting and displaying a live view movie are then started.

In step S1002, the exposure of the image pickup device 506 is started in accordance with exposure settings (storage period/aperture setting/sensitivity setting) determined by the overall control computing unit.

In step S1003, signals are read out from all pixels in the image pickup device 506 exposed in step S1002. In step S1004, the signals read out from all pixels in step S1003 are stored as image data in the frame memory 117.

In step S1005, whether a live view enlargement has been selected by a user or not is determined. If it is determined in step S1005 that a live view enlargement has not been selected, the processing moves to step S1006.

In step S1006, image data undergo resize processing to a pixel size (750×500) of the live view movie size based on all of the image data stored in the frame memory 117.

If it is determined in step S1005 that a live view enlargement has been selected, the processing moves to step S1007. The selection of a live view enlargement occurs in response to a selection of an enlargement frame performed by a user and the press of an enlargement button included in the operating unit 515, for example.

In step S1007, information regarding an enlargement area designated by a user is transmitted from the overall control computing unit 509 to the processing unit 118. The pixel computing unit 118 then calculates a resize ratio for adjusting the image data corresponding to an enlargement area of the image data of all pixels stored in the frame memory 117 to fit to the angle of view of the live view based on information regarding the enlargement area.

In step S1008, based on the resize ratio calculated in step S1007, image data of all pixels stored in the frame memory 117 undergo resize processing based on the enlargement area.

In step S1009, only the image data cut out based on the enlargement area from the image having an image size changed by the resize processing in step S1008 are transmitted to the P/S conversion unit 120.

In step S1010, the image data transmitted in step S1006 or step S1009 are P/S converted based on its data amount in the P/S conversion unit 120, and an optimum transmission speed and an optimum number of ports are selected. The P/S converted image data are transmitted to the imaged signal processing circuit 507.

In step S1020, the imaged signal processing circuit 507 performs developing processing for a live view on the image data output from the P/S conversion unit 120. More specifically, image data processing, correction processing and compression are performed such as low-pass filtering for noise reduction, shading, and white balance processing.

In step S1011, the image data processed in step S1020 are displayed as moving image data on the display unit 511.

If it is determined to continue the shooting in step S1012, the processing returns to step S1002, and the live-view operation is subsequently performed. If it is determined to end the shooting in step S1012, the processing moves to step S1013 where the live view operation ends.

Figure 17A:
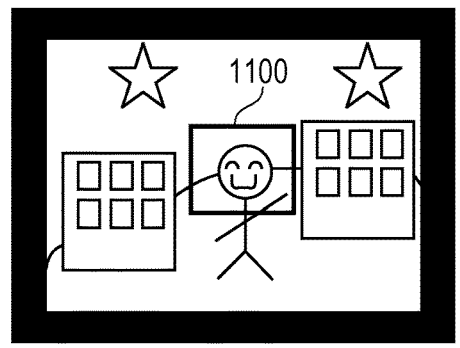
FIG. 17A illustrates an image enlargement method according to the fifth embodiment in detail.

Next, enlargement conversion processing for live view display according to this embodiment will be described with reference to FIGS. 17A to 17E. FIG. 17A illustrates an example of a live view movie to be displayed on the display unit 511 in a case where a user designates to enlarge an enlargement area 1100.

Figure 17B:
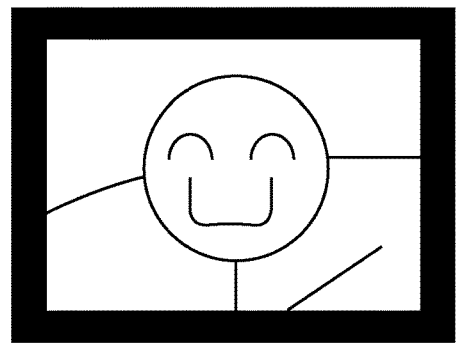
FIG. 17B illustrates an image enlargement method according to the fifth embodiment in detail.

FIG. 17B illustrates the enlargement area 1100 illustrated in FIG. 17A displayed in an enlarged size on the display unit 511. The frame memory 117 stores image data 1101 of all pixels read from the image pickup device at all times, as illustrated in FIG. 17C.

Figure 17C:
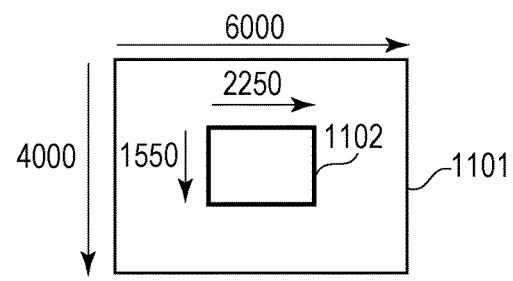
FIG. 17C illustrates an image enlargement method according to the fifth embodiment in detail.
Figure 17D:
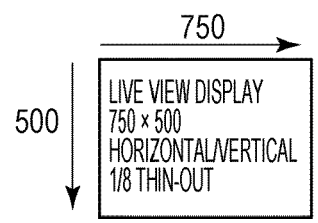
FIG. 17D illustrates an image enlargement method according to the fifth embodiment in detail.
Figure 17E:
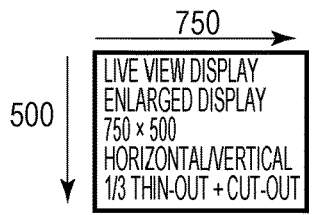
FIG. 17E illustrates an image enlargement method according to the fifth embodiment in detail.
Figure 18:
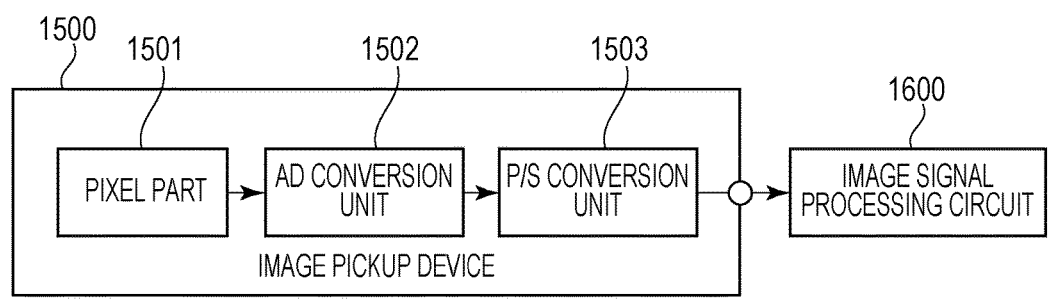
FIG. 18 illustrates a configuration of a general imaging apparatus.

For normal display of a live view, resize conversion processing is performed on the image data of all pixels stored in the frame memory 117 to convert the size of the image data to a pixel size (750×500) which is a live view movie size, as illustrated in FIG. 17D.

On the other hand, in accordance with the enlargement area 1100 selected for live view enlargement, it is controlled such that an area 1102 can be cut out from the image data of all pixels illustrated in FIG. 17C and image data of the cut out area 1102 can then be displayed.

The number of pixels of the cut out area 1102 is assumed to be equal to 2250 pixels×1550 pixels. The image data of the cut out area 1102 undergo resize processing illustrated in FIG. 17E to convert them to the image size 750×500 for live view display.

As described above, according to this embodiment, the image pickup device having a pixel layer and a circuit layer which are stacked has a frame memory in the circuit layer so that image data corresponding to an enlargement area selected by a user during live view display are cut out from image data of all pixels. As a result of optimum resize processing, image data of a size equal to the size of normal live view display can be transmitted. Thus, an enlarged image can be output by keeping the resolution and seamlessly.

Having described embodiments of the present invention, the present invention is not limited to those embodiments and can be modified and changed variously without departing from the spirit and scope.

OTHER EMBODIMENTS

Embodiment (s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment (s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-109426, filed May 29, 2015, Japanese Patent Application No. 2015-109429, filed May 29, 2015, and Japanese Patent Application No. 2016-086544, filed Apr. 22, 2016, which are hereby incorporated by reference herein in their entirety.

The invention claimed is:

1. An image sensor having a first semiconductor substrate and a second semiconductor substrate mutually stacked and electrically directly connected, the image sensor comprising:
   a photoelectric converter provided on the first semiconductor substrate and configured to receive and photoelectrically convert incident light;
   an AD converter configured to convert an analog image signal output from the photoelectric converter to digital image data;
   a memory provided on the second semiconductor substrate and configured to store digital image data of one frame converted by the AD converter;
   a processor provided on the second semiconductor substrate and configured to cut out image data of a predetermined area from the digital image data stored in the memory and perform reducing magnification processing thereon; and
   an output circuit provided on the second semiconductor substrate and configured to output the reducing magnification processed image data outside of the image sensor,
   wherein the size of image data to undergo the reducing magnification processing is set to be constant irrespective of the magnification of the reducing magnification processing.

2. The image sensor according to claim 1, wherein the processor performs electronic pan/tilt processing when image data of a predetermined area is cut out from the image data stored in the memory.

3. The imaging apparatus according to claim 2, wherein the processor performs electronic pan/tilt processing when image data of a predetermined area is cut out from the image data stored in the memory.

4. An image sensor having a first semiconductor substrate and a second semiconductor substrate mutually stacked and electrically directly connected, the image sensor comprising:
   a photoelectric converter provided on the first semiconductor substrate and configured to receive and photoelectrically convert incident light;
   an AD converter configured to convert an analog image signal output from the photoelectric converter to digital image data;
   a memory provided on the second semiconductor substrate and configured to store digital image data of one frame converted by the AD converter;
   a processor provided on the second semiconductor substrate and configured to cut out image data of a predetermined area from the digital image data stored in the memory and perform reducing magnification processing thereon; and
   an output circuit provided on the second semiconductor substrate and configured to output the reducing magnification processed image data outside of the image sensor,
   wherein the size of image data to undergo the reducing magnification processing by the processor has a video image size for recording.

5. An image sensor having a first semiconductor substrate and a second semiconductor substrate mutually stacked and electrically directly connected, the image sensor comprising:
   a photoelectric converter provided on the first semiconductor substrate and configured to receive and photoelectrically convert incident light;
   an AD converter configured to convert an analog image signal output from the photoelectric converter to digital image data;
   a memory provided on the second semiconductor substrate and configured to store digital image data of one frame converted by the AD converter;
   a processor provided on the second semiconductor substrate and configured to perform reducing magnification processing on the digital image data stored in the memory; and
   an output circuit provided on the second semiconductor substrate and configured to output the reducing magnification processed image data outside of the image sensor,
   wherein the size of image data having undergone the reducing magnification processing by the processor is set to be equal to or lower than an output transfer capability of the output circuit.

6. The image sensor according to claim 5, wherein the processor cuts out image data of a predetermined area from digital image data of one frame before storage in the memory and stores the cut out image data in the memory.

7. The image pickup device according to claim 6, wherein the processor performs electronic pan/tilt processing when image data of a predetermined area is cut out from the image data stored in the memory.

8. An imaging apparatus comprising:
   an image sensor having a first semiconductor substrate and a second semiconductor substrate mutually stacked and electrically directly connected, the image sensor including:
      a photoelectric converter provided on the first semiconductor substrate and configured to receive and photoelectrically convert incident light,
      an AD converter configured to convert an analog image signal output from the photoelectric converter to digital image data,
      a memory provided on the second semiconductor substrate and configured to store digital image data of one frame converted by the AD converter,
      a processor provided on the second semiconductor substrate and configured to cut out image data of a predetermined area from the digital image data stored in the memory and perform reducing magnification processing thereon, and an output circuit provided on the second semiconductor substrate and configured to output the reducing magnification processed image data outside of the image sensor;

a signal processor configured to perform a predetermined signal process on image data output from the image sensor;

a display configured to display the image; and a controller configured to control the image sensor, the signal processor, and the display, wherein the size of image data to undergo the reducing magnification processing is set to be constant irrespective of the magnification of the reducing magnification processing.

9. The imaging apparatus according to claim 8, wherein the processor performs electronic pan/tilt processing when image data of a predetermined area is cut out from the image data stored in the memory.

10. An imaging apparatus comprising:

an image sensor having a first semiconductor substrate and a second semiconductor substrate mutually stacked and electrically directly connected, the image sensor including:

a photoelectric converter provided on the first semiconductor substrate and configured to receive and photoelectrically convert incident light, an AD converter configured to convert an analog image signal output from the photoelectric converter to digital image data, a memory provided on the second semiconductor substrate and configured to store digital image data of one frame converted by the AD converter, a processor provided on the second semiconductor substrate and configured to cut out image data of a predetermined area from the digital image data stored in the memory and perform reducing magnification processing thereon, and an output circuit provided on the second semiconductor substrate and configured to output the reducing magnification processed image data outside of the image sensor;

a signal processor configured to perform a predetermined signal process on image data output from the image sensor;

a display configured to display the image; and a controller configured to control the image sensor, the signal processor, and the display, wherein the size of image data to undergo the reducing magnification processing by the processing unit has a video image size for recording.

11. The imaging apparatus comprising:

an image sensor having a first semiconductor substrate and a second semiconductor substrate mutually stacked and electrically directly connected, the image sensor including:

a photoelectric converter provided on the first semiconductor substrate and configured to receive and photoelectrically convert incident light, an AD converter configured to convert an analog image signal output from the photoelectric converter to digital image data, a memory provided on the second semiconductor substrate and configured to store digital image data of one frame converted by the AD converter, a processor provided on the second semiconductor substrate and configured to cut out image data of a predetermined area from the digital image data stored in the memory and perform reducing magnification processing thereon, and an output circuit provided on the second semiconductor substrate and configured to output the reducing magnification processed image data outside of the image sensor;

a signal processor configured to perform a predetermined signal process on image data output from the image sensor;

a display configured to display the image; and a controller configured to control the image sensor, the signal processor, and the display, wherein the size of image data having undergone the reducing magnification processing by the processing unit is set to be equal to or lower than an output transfer capability of the output circuit.

12. The imaging apparatus according to claim 11, wherein the processor cuts out image data of a predetermined area from digital image data of one frame before storage in the memory and stores the cut out image data in the memory.

* * * * *

UNITED STATES PATENT AND TRADEMARK OFFICE
CERTIFICATE OF CORRECTION

PATENT NO. : 10,356,339 B2
APPLICATION NO. : 15/567145
DATED : July 16, 2019
INVENTOR(S) : Makoto Ise and Shinobu Watanabe Page 1 of 1

It is certified that error appears in the above-identified patent and that said Letters Patent is hereby corrected as shown below:

On the Title Page

Item (22), delete "PCT Filed: May 24, 2016", and insert --PCT Filed: May 25, 2016--.

Signed and Sealed this
Fourteenth Day of April, 2020

Andrei Iancu
*Director of the United States Patent and Trademark Office*